(12) United States Patent
Ikeda et al.

(10) Patent No.: US 7,919,340 B2
(45) Date of Patent: Apr. 5, 2011

(54) METHOD FOR MANUFACTURING LIGHT-EMITTING DEVICE

(75) Inventors: Hisao Ikeda, Kanagawa (JP); Takahiro Ibe, Kanagawa (JP)

(73) Assignee: Semiconductor Energy laboratory Co., Ltd. (JP)

( * ) Notice: Subject to any disclaimer, the term of this patent is extended or adjusted under 35 U.S.C. 154(b) by 120 days.

(21) Appl. No.: 12/476,556

(22) Filed: Jun. 2, 2009

(65) Prior Publication Data

US 2009/0305445 A1   Dec. 10, 2009

(30) Foreign Application Priority Data

Jun. 4, 2008 (JP) .................... 2008-146716

(51) Int. Cl.
*H01L 33/00* (2010.01)
(52) U.S. Cl. .............. 438/29; 438/22; 257/E33.001
(58) Field of Classification Search ............. 438/22, 438/29, 587; 257/E33.001, E21.211
See application file for complete search history.

(56) References Cited

U.S. PATENT DOCUMENTS

| | | | |
|---|---|---|---|
| 4,772,582 A | 9/1988 | DeBoer | |
| 5,742,129 A | 4/1998 | Nagayama et al. | |
| 5,851,709 A | 12/1998 | Grande et al. | |
| 5,937,272 A | 8/1999 | Tang | |
| 6,165,543 A | 12/2000 | Otsuki et al. | |
| 6,682,863 B2 * | 1/2004 | Rivers et al. | 430/22 |
| 2006/0040200 A1 * | 2/2006 | Song et al. | 430/199 |
| 2006/0084006 A1 * | 4/2006 | Kang et al. | 430/199 |
| 2006/0246240 A1 | 11/2006 | Matsuda et al. | |
| 2007/0057264 A1 * | 3/2007 | Matsuda | 257/88 |
| 2008/0124647 A1 * | 5/2008 | Matsuda et al. | 430/270.1 |
| 2008/0299496 A1 | 12/2008 | Hirakata et al. | |

FOREIGN PATENT DOCUMENTS

| | | |
|---|---|---|
| EP | 0 851 714 A2 | 7/1998 |
| EP | 1 176 642 A2 | 1/2002 |
| JP | 10-208881 | 8/1998 |
| JP | 2000-77182 | 3/2000 |
| JP | 2002-110350 | 4/2002 |
| JP | 2006-309995 | 11/2006 |

* cited by examiner

*Primary Examiner* — Matthew S Smith
*Assistant Examiner* — Michele Fan
(74) *Attorney, Agent, or Firm* — Husch Blackwell LLP

(57) ABSTRACT

In the present invention, a first substrate which is an evaporation donor substrate is prepared in which a material layer is formed over a patterned reflective layer. A surface of the material layer over the first substrate is irradiated with first light which satisfies one predetermined irradiation condition to pattern the material layer. A surface opposite to the surface of the first substrate is irradiated with second light which satisfies another predetermined irradiation condition to evaporate the patterned material layer onto a second substrate, which is a deposition target substrate. According to the present invention, deterioration of a material included in the material layer can be prevented and a film pattern can be formed on the second substrate with high accuracy.

36 Claims, 16 Drawing Sheets

FIG. 9A
FIG. 9C
B–B' cross section
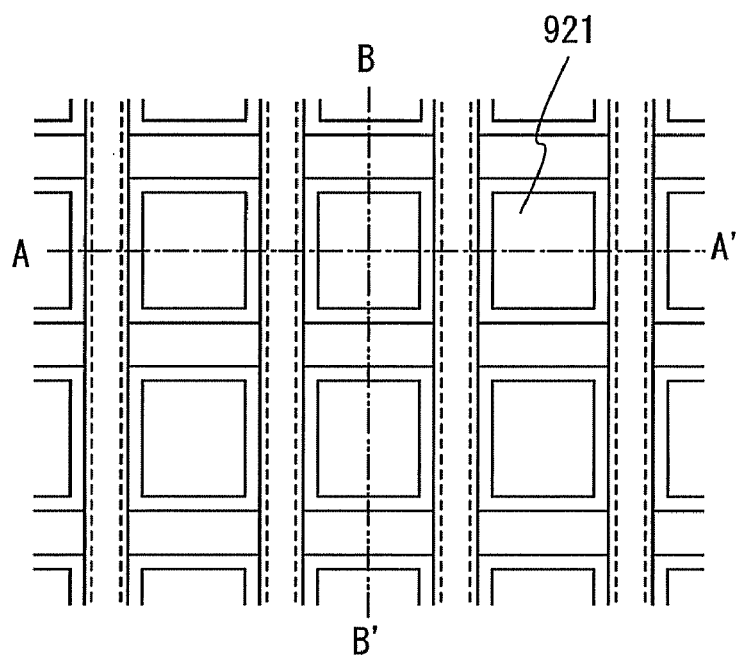
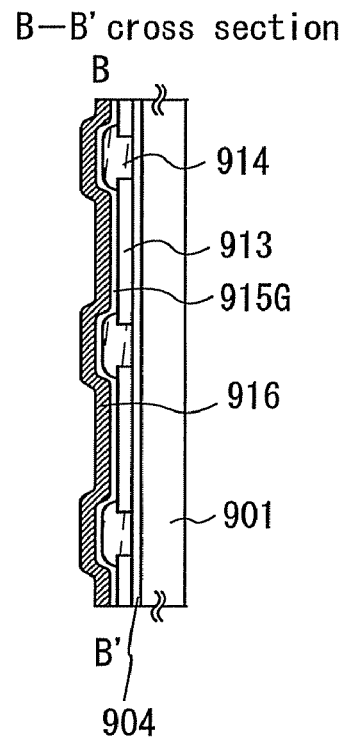
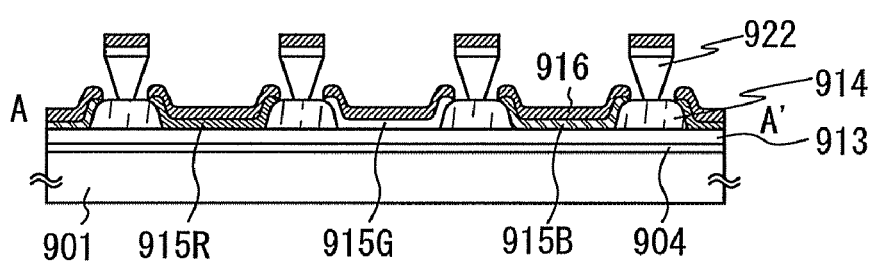
A–A' cross section
FIG. 9B

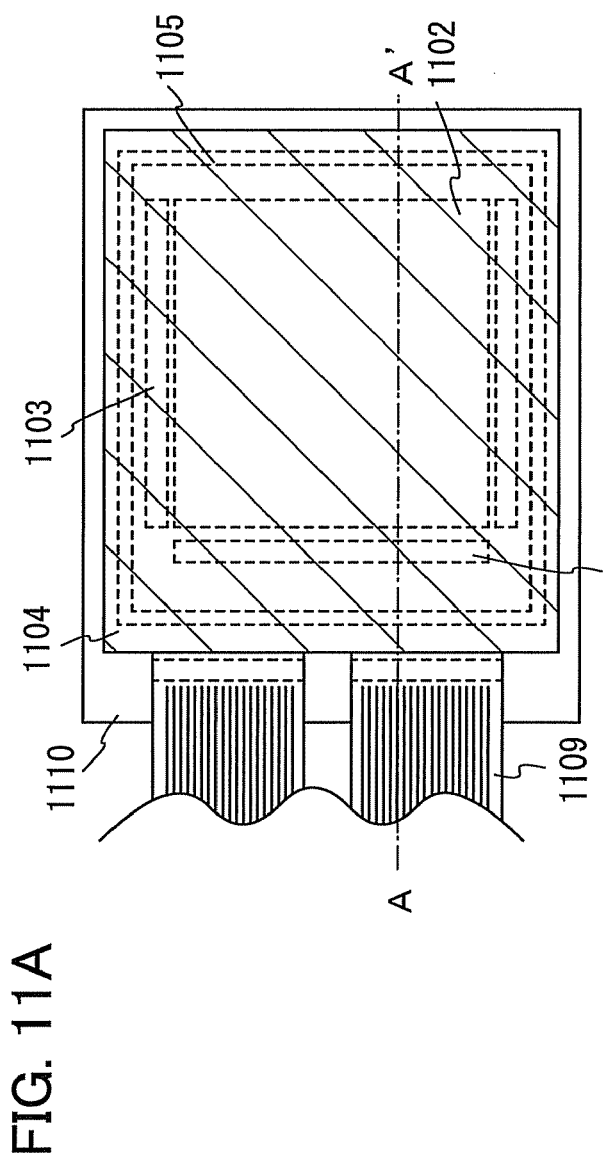
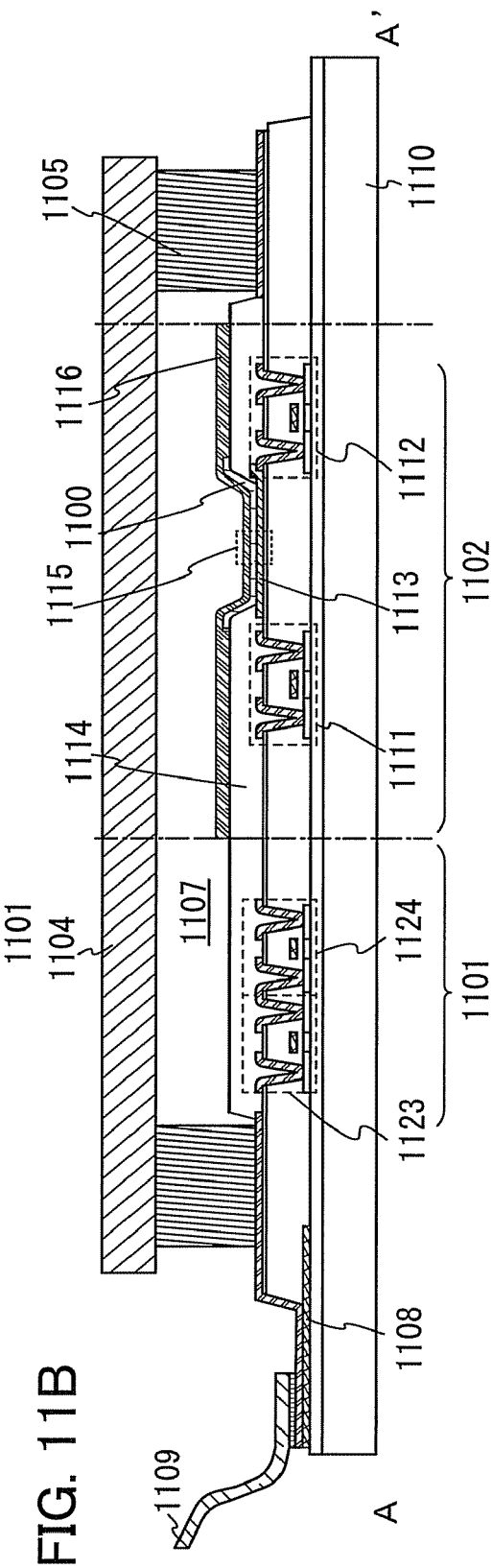
FIG. 11A
FIG. 11B

METHOD FOR MANUFACTURING LIGHT-EMITTING DEVICE

BACKGROUND OF THE INVENTION

1. Field of the Invention

The present invention relates to a method for manufacturing a light-emitting device using an evaporation method.

2. Description of the Related Art

Light-emitting elements which include organic compounds as a light-emitter and are characterized by thinness, lightweight, fast response, and direct current driving with low voltage are expected to be applied to next-generation flat panel displays. In particular, a display device in which light-emitting elements are arranged in a matrix has advantages in a wide viewing angle and excellent visibility over a conventional liquid crystal display device.

A light emission mechanism of a light-emitting element is described below. When voltage is applied between a pair of electrodes by which an EL layer is sandwiched, an exciton is formed with an electron injected from a cathode and a hole injected from an anode. When the exciton recombines at an emission center in the EL layer and relaxes to the ground state, energy is released as light from the EL layer. As excited states, a singlet excited state and a triplet excited state are known, and it is thought that light emission is possible through either of those excited states.

An EL layer included in a light-emitting element has at least a light emitting layer. The EL layer can have a stacked-layer structure including a hole-injecting layer, a hole-transporting layer, an electron-transporting layer, an electron-injecting layer, and/or the like in addition to the light emitting layer.

EL materials for forming the EL layer are broadly classified into a low molecular (a monomer) material and a high molecular (a polymer) material. In general, a film of a low molecular material is often formed by an evaporation method and a film of a high molecular material is often formed by an ink-jet method or the like.

An evaporation apparatus which is used in an evaporation method has a substrate holder to which a substrate is mounted; a crucible (or an evaporation boat) containing an EL material, that is, an evaporation material; a heater for heating the EL material in the crucible; and a shutter for preventing the EL material from being scattered. The EL material which is heated by the heater is sublimated and deposited onto the substrate.

Note that in order to achieve uniform deposition, actually, a deposition target substrate needs to be rotated and the substrate and the crucible need to be separated from each other by at least a certain distance. In addition, when films of different colors are separately formed using a plurality of EL materials through a mask such as a metal mask, it is necessary that the distance between pixels be designed to be large so that the width of a partition (a bank) formed of an insulator between pixels is large. Such needs are major problems in advancing high definition (increasing the number of pixels) and miniaturization of pixel pitches along with downsize of a light-emitting device including a light-emitting element.

Therefore, as for flat panel displays, it has been necessary to solve those problems as well as to achieve high productivity and cost reduction in order to achieve higher definition and higher reliability.

Thus, a method for forming an EL layer of a light-emitting element by laser thermal transfer has been proposed (see Patent Document 1). In Patent Document 1, a transfer substrate is described which has, over a supporting substrate, a photothermal conversion layer including a low reflective layer and a high reflective layer and a transfer layer. Irradiation of such a transfer substrate with laser light allows the transfer layer to be transferred to an element-forming substrate.

[Patent Document]

[Patent Document 1] Japanese Published Patent Application No. 2006-309995

SUMMARY OF THE INVENTION

However, when the transfer substrate, in which the transfer layer is formed over the high reflective layer and the low reflective layer, is irradiated with laser light to transfer the transfer layer onto the deposition target substrate directly as described in Patent Document 1, heat generated in the low reflective layer is conducted to the high reflective layer when the irradiation time with the laser light is long, whereby not only a part of the transfer layer which is over the low reflective layer but also a part of the transfer layer which is over the high reflective layer is highly likely to be transferred. In contrast, when irradiation with laser light having high output power is performed instantaneously in order to shorten the irradiation time with laser light, only the part of the transfer layer which is over the low reflective layer is transferred to form a desired evaporation pattern; however, the transfer layer has a high temperature at the moment that irradiation with the laser light is performed, which may lead to decomposition or deterioration of a material included in the transfer layer. Further, the transferred film formed in this manner likely has much roughness and a poor film quality.

In view of the above, an embodiment of the present invention is to provide a method for manufacturing a high-definition light-emitting device with a high light-emitting property and a long lifetime. Since the manufacturing method employs a method with which a material layer to be transferred is prevented from being evaporated beyond necessity, a desired evaporation pattern can be formed, and deterioration of a material to be evaporated or the like is hardly caused during transfer.

An embodiment of the present invention is a method for manufacturing a light-emitting device. In the method, a surface of a material layer formed over a first substrate is irradiated with first light to pattern the material layer and then a surface of the first substrate opposite to the surface of the material layer is irradiated with second light to evaporate (or transfer) the patterned material layer onto a second substrate, which is a deposition target substrate.

A structure of the present invention is a method for manufacturing a light-emitting device including the steps of forming a light absorption layer on one surface of a first substrate; forming a reflective layer having an opening in contact with the light absorption layer; forming a material layer in contact with the light absorption layer and the reflective layer; irradiating the one surface of the first substrate with first light which satisfies a general formula (1), preferably, a general formula (2):

$$1/A_1^{1.5} \leq B_1 \leq 10^6/A_1^{1.5} \text{ and } B_1 \leq 10^{-3}(s) \quad (1)$$

$$10/A_1^{1.5} \leq B_1 \leq 10^5/A_1^{1.5} \text{ and } B_1 \leq 10^{-3}(s) \quad (2)$$

where light intensity is $A_1$ (W/cm$^2$) and irradiation time is $B_1$ (s); removing a part of the material layer which overlaps with the opening of the reflective layer; facing one surface of the first substrate and a surface of the second substrate closely; irradiating the other surface of the first substrate with second light which satisfies a general formula (3), preferably, a general formula (4):

$$1/A_2^{1.5} \leq B_2 \leq 10^6/A_2^{1.5} \text{ and } B_2 \geq 10^{-4}(s) \quad (3)$$

$$10/A_2^{1.5} \leq B_2 \leq 10^5/A_2^{1.5} \text{ and } B_2 \geq 10^{-4}(s) \quad (4)$$

where light intensity is $A_2$ (W/cm²) and irradiation time is $B_2$ (s); and evaporating the material layer which overlaps with the reflective layer onto the deposition target surface of the second substrate.

A structure of the present invention is a method for manufacturing a light-emitting device including the steps of forming a light absorption layer on one surface of a first substrate; forming a reflective layer having an opening in contact with the light absorption layer; forming a material layer in contact with the light absorption layer and the reflective layer; irradiating the one surface of the first substrate with first light which satisfies a general formula (1), preferably, a general formula (2):

$$1/A_1^{1.5} \leq B_1 \leq 10^6/A_1^{1.5} \text{ and } B_1 \leq 10^{-4}(s) \quad (1)$$

$$10/A_1^{1.5} \leq B_1 \leq 10^5/A_1^{1.5} \text{ and } B_1 \leq 10^{-3}(s) \quad (2)$$

where light intensity is $A_1$ (W/cm²) and irradiation time is $B_1$ (s); removing a part of the material layer which overlaps with the opening of the reflective layer; facing one surface of the first substrate and a surface of the second substrate closely; and heating the first substrate to evaporate the material layer which overlaps with the reflective layer onto the deposition target surface of the second substrate.

In each of the above structures, the first light is laser light and preferably has a wavelength of 450 nm or longer.

In each of the above structures, the light absorption layer has a reflectance of 70% or lower with respect to light and includes any of tantalum nitride, titanium nitride, chromium nitride, manganese nitride, titanium, and carbon.

In each of the above structures, the reflective layer has a reflectance of 85% or higher with respect to light and includes any of aluminium, silver, gold, platinum, copper, an alloy containing aluminum, an alloy containing silver, and indium tin oxide.

In each of the above structures, the material layer is formed with an organic compound and includes either or both of a light-emitting material and a carrier-transporting material.

The present invention also covers an electronic appliance including a light-emitting device, as well as a light-emitting device including a light-emitting element. Accordingly, a light-emitting device in this specification refers to an image display device, a light-emitting device, and a light source (including an illumination device). In addition, the light-emitting device also includes any of the following modules in its category: a module in which a light-emitting device is connected to a connector such as an flexible printed circuit (FPC), a tape automated bonding (TAB) tape, or a tape carrier package (TCP); a module in which a printed wiring board is provided on the tip of a TAB tape or a TCP; and a module in which an integrated circuit (IC) is directly mounted onto a light-emitting element by chip on glass (COG) bonding.

In a method for manufacturing a light-emitting device according to an embodiment of the present invention, a material layer over an evaporation donor substrate can be patterned and deposited onto a deposition target substrate by performing light irradiation twice. Specifically, the material layer formed over the evaporation donor substrate is patterned by first light irradiation and the patterned material layer is evaporated onto the deposition target substrate by second light irradiation; thus, the material layer can be evaporated (or transferred) with high accuracy, and a high-definition light-emitting device with a high light-emitting property and a long lifetime can be manufactured.

Note that a light source which instantaneously emits high-intensity light is used in the first light irradiation; therefore, irradiation time can be shortened and misplacement of a pattern region due to heat conduction can be prevented. Note that in the first light irradiation, the first light enters one surface of the material layer formed over a first substrate; therefore, the intensity of light can be low compared with a case where light enters the other surface of the first substrate. Accordingly, deterioration of the material layer due to light irradiation can be prevented.

Further, since the material layer over the evaporation donor substrate is patterned in the first light irradiation, a light source which emits light with minimum intensity needed for evaporation may be used for the second light irradiation. Accordingly, the material layer which is evaporated (or transferred) onto the deposition target substrate is prevented from being deteriorated by light irradiation.

Note that when a lamp is used as a light source in the second light irradiation, since a film can be evaporated onto a large area at one time, productivity of the light-emitting device can be improved. In addition, in the present invention, the second light irradiation is performed to evaporate the patterned material layer onto the deposition target substrate; therefore, a simple method in which the evaporation donor substrate is directly or indirectly heated may be employed instead of the second light irradiation.

BRIEF DESCRIPTION OF THE DRAWINGS

FIGS. 9A to 9C show a passive-matrix light-emitting device.

FIGS. 11A and 11B show an active-matrix light-emitting device.

DETAILED DESCRIPTION OF THE INVENTION

Hereinafter, embodiments of the present invention will be described in detail with reference to the drawings. Note that the present invention is not limited to the description given below, and modes and details of the present invention can be modified in various ways without departing from the spirit and scope of the present invention. Accordingly, the present invention should not be construed as being limited to the description of the embodiments given below.

Embodiment 1

In Embodiment 1, a deposition method according to the present invention in which an evaporation donor substrate is used is described. Note that in Embodiment 1, a case is described where an evaporation material is patterned over the evaporation donor substrate and an EL layer of a light-emitting element is formed with use of the patterned evaporation material.

Figure 1A:
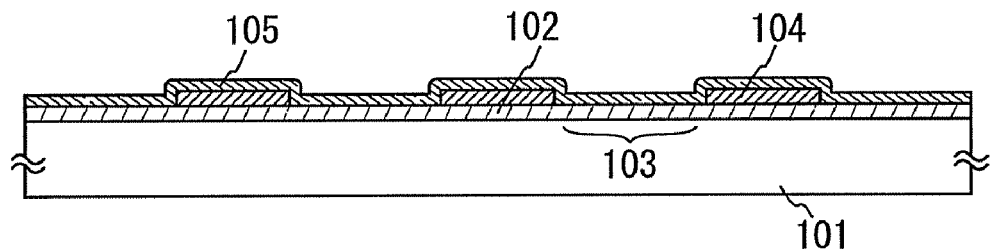
FIGS. 1A to 1D show a method for manufacturing an evaporation donor substrate according to an embodiment of the present invention.

The evaporation donor substrate used in the present invention is described with reference to FIGS. 1A to 1D. As shown in FIG. 1A, a light absorption layer 102 is formed over a first substrate 101, which is a supporting substrate, a reflective layer 104 having openings 103 is formed over the light absorption layer 102, and a material layer 105 is formed over the light absorption layer 102 and the reflective layer 104. Note that a part of the material layer 105 covers the openings 103.

In FIG. 1A, the light absorption layer 102, the reflective layer 104 having the openings 103, and the material layer 105 are formed over the entire surface of the first substrate 101.

As the first substrate 101, for example, a glass substrate, a quartz substrate, a plastic substrate containing an inorganic material, or a substrate formed using molybdenum and/or tungsten can be used.

The light absorption layer 102 absorbs light which is used for irradiation in evaporation. Therefore, it is preferable that the light absorption layer 102 be formed using a material which has a low reflectance and high absorptance with respect to the irradiation light. Specifically, it is preferable that the light absorption layer 102 have a reflectance of 70% or lower with respect to the irradiation light.

Further, as a material which can be used for the light absorption layer 102, for example, a metal nitride such as titanium nitride, tantalum nitride, molybdenum nitride, tungsten nitride, chromium nitride, and manganese nitride; molybdenum; titanium; tungsten; or carbon is preferably used. Note that the light absorption layer 102 is not limited to a single layer and may include a plurality of layers.

Since a kind of material which is suitable for the light absorption layer 102 differs depending on the wavelength of the irradiation light, the material of the light absorption layer 102 needs to be selected as appropriate.

Further, the light absorption layer 102 can be formed by any of a variety of methods. For example, the light absorption layer 102 can be formed by a sputtering method, an electron beam evaporation method, or a vacuum evaporation method.

In addition, it is preferable that the light absorption layer 102 have a thickness with which the irradiation light is not transmitted (the thickness of 100 nm to 2 μm, inclusive, is preferable) although it depends on a material to be irradiated. In particular, with a thickness of 100 nm to 600 nm, inclusive, the light absorption layer 102 can efficiently absorb the irradiation light to generate heat. In addition, the light absorption layer 102 having a thickness of 100 nm to 600 nm, inclusive, allows highly accurate deposition onto the deposition target substrate.

The light absorption layer 102 may partially transmit the irradiation light as long as the evaporation material contained in the material layer 105 can be heated up to the sublimation temperature. Note that in a case where the light absorption layer 102 partially transmits the irradiation light, it is preferable that a material which is not decomposed by light be used as the evaporation material contained in the material layer 105.

Figure 1B:
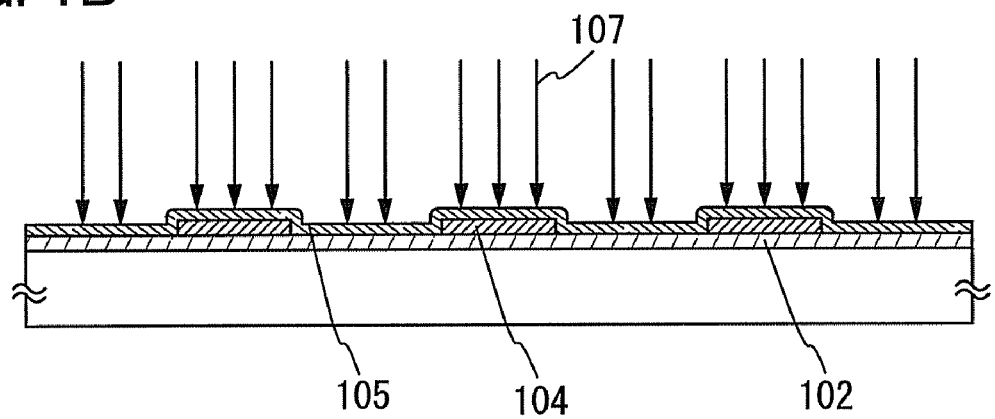
Figure 1C:
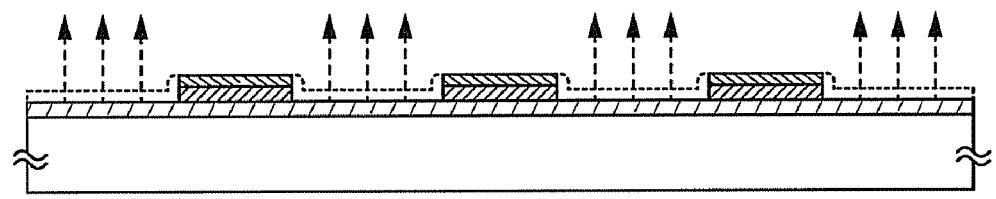

When first light 107 enters the material layer 105 as shown in FIG. 1B, the reflective layer 104 has such a function that the first light 107 is selectively absorbed in a part of the light absorption layer 102 and reflected at the other part of the light absorption layer 102. Therefore, the reflective layer 104 is preferably formed with a material having a high reflectance with respect to the first light 107. Specifically, the reflective layer 104 preferably has a reflectance of 85% or more, more preferably, a reflectance of 90% or higher with respect to the irradiation light.

Further, examples of a material which can be used for the reflective layer 104 include aluminum, silver, gold, platinum, copper, an alloy containing aluminum (for example, an aluminum-titanium alloy, an aluminum-neodymium alloy, and an aluminum-titanium alloy), and an alloy containing silver (a silver-neodymium alloy).

Note that the reflective layer 104 can be formed by any of a variety of methods. For example, the reflective layer 104 can be formed by a sputtering method, an electron beam evaporation method, or a vacuum evaporation method. It is preferable that the reflective layer 104 have a thickness of 100 nm or more although it depends on a material. With a thickness of 100 nm or more, the reflective layer 104 can suppress transmission of the irradiation light through the reflective layer 104.

A variety of methods can be used for formation of the openings 103 in this embodiment, and dry etching is preferably used. By dry etching, the openings 103 have sharper sidewalls, and thus a minute pattern can be deposited.

In addition, the greater the difference in reflectance between the reflective layer 104 and the light absorption layer 102 is, the more preferable it is. Specifically, the difference in reflectance with respect to the wavelength of the irradiation light is preferably 25% or higher, more preferably, 30% or higher.

The material layer 105 includes the evaporation material, which is to be evaporated onto the deposition target substrate. Then, by irradiation of the evaporation donor substrate with light, the material layer 105 is heated and the evaporation material is sublimated and evaporated onto the deposition target substrate.

Note that any of a variety of materials can be used as the evaporation material included in the material layer 105 regardless of whether they are organic compounds or inorganic compounds, as long as the material can be evaporated. In the case of forming an EL layer of a light-emitting element as described in this embodiment, a material which can be evaporated to form an EL layer is used. For example, an organic compound which forms an EL layer, such as a light-emitting material or a carrier-transporting material, a carrier-injecting material, or an inorganic compound which is used for an electrode or the like of a light-emitting element, such as metal oxide, metal nitride, metal halide, or an elementary substance of metal can be used. Note that details of the materials which can be evaporated to form an EL layer is given not here but in Embodiment 5; therefore, Embodiment 5 is referred to for details.

The material layer 105 may include a plurality of materials. In addition, the material layer 105 may be a single layer or a stack of a plurality of layers. By stacking a plurality of layers each including an evaporation material, co-evaporation is possible. Note that in the case where the material layer 105 has a stacked-layer structure, it is preferable that the material layer 105 be formed over the first substrate so as to form an evaporation material having a low sublimation temperature (or a low evaporation temperature) closer to the first substrate. Such a structure allows the material layer 105 which has a stacked-layer structure to be efficiently evaporated.

The material layer 105 is formed by any of a variety of methods. For example, a wet method such as a spin coating method, a spray coating method, an ink-jet method, a dip coating method, a casting method, a die coating method, a roll coating method, a blade coating method, a bar coating method, a gravure coating method, or a printing method can be used. Alternatively, a dry method such as a vacuum evaporation method or a sputtering method can be used.

In order to form the material layer 105 by a wet method, a predetermined evaporation material may be dissolved or dispersed in a solvent, and a solution or a dispersion may be adjusted. There is no particular limitation on the solvent as long as it can dissolve or disperse the evaporation material and it does not react with the evaporation material. Examples of the solvent are as follows: halogen-based solvents such as chloroform, tetra chloromethane, dichloromethane, 1,2-dichloroethane, and chlorobenzene; ketone-based solvents such as acetone, methyl ethyl ketone, diethyl ketone, n-propyl methyl ketone, and cyclohexanone; aromatic-based solvents such as benzene, toluene, and xylene; ester-based solvents such as ethyl acetate, n-propyl acetate, n-butyl acetate, ethyl propionate, γ-butyrolactone, and diethyl carbonate; ether-based solvents such as tetrahydrofuran and dioxane; amide-based solvents such as dimethylformamide and dimethylacetamide; dimethyl sulfoxide; hexane; water; and the like. Further, a mixture of plural kinds of those solvents may be used. By using a wet method, it is possible to increase material use efficiency, which leads to a reduction in manufacturing cost.

Then, as shown in FIG. 1B, a surface where the light absorption layer 102, the reflective layer 104, and the material layer 105 are formed over one surface of the first substrate 101 in this order is irradiated with the first light 107. The light passes through the material layer 105 over the first substrate 101, then, light which enters the reflective layer 104 is reflected while light which enters the openings 103 is absorbed by the light absorption layer 102. The light absorption layer 102 absorbs light to generate heat and provides the heat to the evaporation material included in the material layer 105 to sublimate a part of the material layer 105 (see FIG. 1C).

Figure 1D:
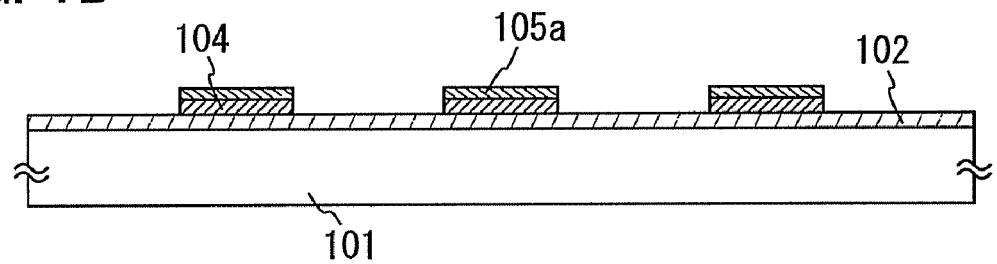

In this manner, the evaporation donor substrate in which a material layer 105a is provided so as to overlap with the reflective layer 104 over the first substrate 101 can be formed (see FIG. 1D).

A laser is used as a light source of the first light 107, which is used for irradiation. The first light 107, which is used for the irradiation, satisfies a general formula (1), preferably a general formula (2), which are given below, where light intensity is $A_1$ (W/cm$^2$) and irradiation time is $B_1$ (s). Note that the general formula (1) given below corresponds to a region a (1401) in FIG. 14.

$$1/A_1^{1.5} \leq B_1 \leq 10^6/A_1^{1.5} \text{ and } B_1 \leq 10^{-3}(s) \quad (1)$$

$$10/A_1^{1.5} \leq B_1 \leq 10^5/A_1^{1.5} \text{ and } B_1 \leq 10^{-3}(s) \quad (2)$$

The first light, which is used for irradiation, passes through the material layer 105 and reaches the reflective layer 104 or the light absorption layer 102. Therefore, in order to prevent deterioration of the material layer 105, the first light is preferably has a wavelength of 450 nm or longer. For example, laser light with a wavelength of 488 nm, 514 nm, 527 nm, 532 nm, 561 nm, or 1024 nm can be used. In addition, the first light, which is used for irradiation, preferably has a wavelength with which the first light is absorbed as little as possible by the material layer 105. If a laser is used as a light source, conversion of the laser light into heat is sufficiently conducted in the light absorption layer 102 even if the irradiation time is short. Therefore, the precision of the shape of the material layer 105a formed by the partial sublimation of the evaporation material can be improved.

As the laser light, laser light emitted from one or more of the following can be used: a gas laser such as an Ar laser, a Kr laser, or an excimer laser; a solid-state laser medium of which is single-crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ which is doped with one or more of Nd, Yb, Cr, Ti, Ho, Er, Tm, and Ta as a dopant; a glass laser; a ruby laser; an alexandrite laser; a Ti:sapphire laser; or a fiber laser. Further, a second harmonic or a third harmonic emitted from the aforementioned solid-state laser can be used. Note that when a solid-state laser whose laser medium is solid is used, there are advantages in that a maintenance-free condition can be maintained for a long time and output power is relatively stable.

Further, a pulsed laser beam, a continuous-wave (CW) laser beam, or the like can be emitted from the aforementioned lasers. Note that, in the case of pulsed laser light, for example, by using not only laser light having a repetition rate of several Hz to several hundreds of kHz but also laser light having a repetition rate of 1 MHz or greater can be used. In addition, a laser spot preferably has a linear shape or a rectangular shape.

In the present invention, the material layer 105 is heated not with radiation heat from the irradiation light but with heat conducted by the light absorption layer 102 which absorbs the irradiation light. Therefore, heat is conducted in a lateral direction of the absorption layer 102, from a part of the light absorption layer 102 which is irradiated with light to the other part of the light absorption layer 102 which is not irradiated with the light. Therefore, it is preferable to set light irradiation time of the material layer 105 be short so that an area of the material layer 105 which is heated is not enlarged. In particular, in the case of a pulsed laser, the length of the major axis of the laser spot can be increased to approximately 1 m, whereby processing time is shortened and productivity is improved.

In addition, pattern formation of the material layer 105 is preferably performed under a reduced-pressure atmosphere by the light irradiation. Accordingly, it is preferable that a reaction chamber have a pressure of 5×10$^{-3}$ Pa or less, more preferably, 10$^{-6}$ Pa to 10$^{-4}$ Pa, inclusive.

Next, a deposition method in which the first substrate 101 having the material layer 105a shown in FIG. 1D is used as an evaporation donor substrate is described with reference to FIGS. 2A to 2C. Note that a method for forming an EL layer of a light-emitting element with use of the evaporation donor substrate is described here.

Figure 2A:
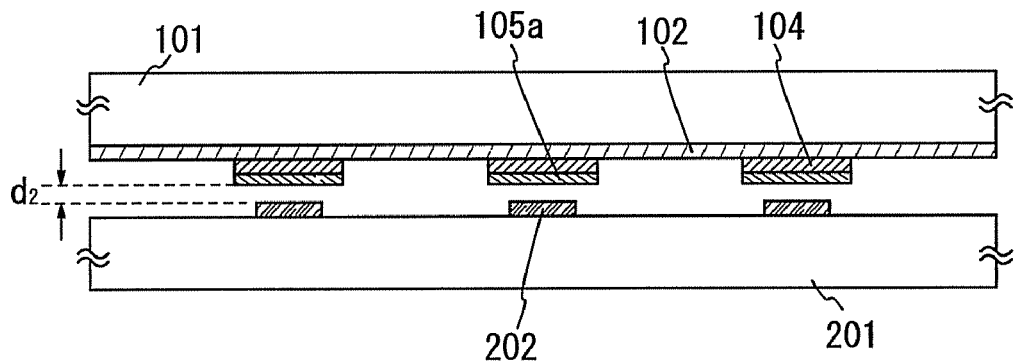
FIGS. 2A to 2C show a method for manufacturing an evaporation donor substrate according to an embodiment of the present invention.

As in FIG. 2A, a surface where the light absorption layer 102, the reflective layer 104, and the material layer 105a are formed over the first substrate 101 in this order, and a deposition surface of the second substrate 201 are opposed to each other.

The second substrate 201 is a deposition target substrate onto which a desired layer is to be deposited by evaporation treatment using the evaporation donor substrate. Note that since the case where an EL layer of a light-emitting element is formed using an evaporation donor substrate is described here, a first electrode 202 which is to be one of electrodes of the light-emitting element is formed over the second substrate 201. Then, the first substrate 101 and the second substrate 201 are arranged so as to face each other in proximity; specifically, they are arranged close to each other so that the distance $d_2$ between the surface of the material layer 105a of the first substrate 101 and a surface of the second substrate 201 (in particular, a surface of the first electrode 202) becomes 0 μm to 10 μm, inclusive, preferably, 0 μm to 5 μm, inclusive, or more preferably, 0 μm to 3 μm, inclusive.

Figure 3A:
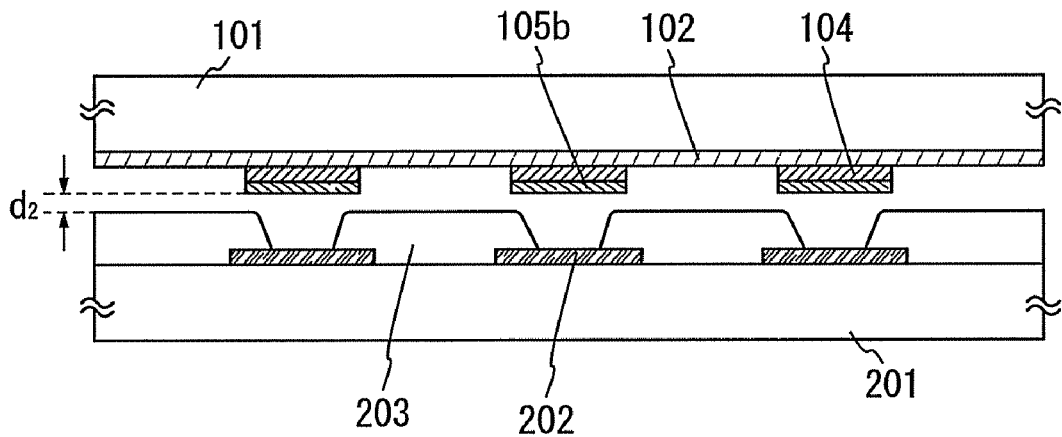
FIGS. 3A to 3C show an evaporation donor substrate and a deposition method according to an embodiment of the present invention.

Note that the distance $d_2$ is defined as the distance between the outermost surface of the first substrate 101 and the outermost surface of the second substrate 201. Therefore, when the first electrode 202 is formed over the second substrate 201 and an insulator 203 is formed over the second substrate 201 so as to cover an end portion of the first electrode 202 as shown in FIG. 3A, the distance $d_2$ is defined as the distance between the surface of the material layer 105b over the first substrate 101 and a surface of the insulator 203 formed over the second substrate 201. Note that when the surface of the material layer 105b over the first substrate 101 and the outermost surface of the insulator 203 over the second substrate 201 has projections and depressions, the distance $d_2$ is defined as the shortest distance between the surface of the material layer 105b over the first substrate 101 and the outermost surface of the insulator 203 formed over the second substrate 201.

Figure 2B:
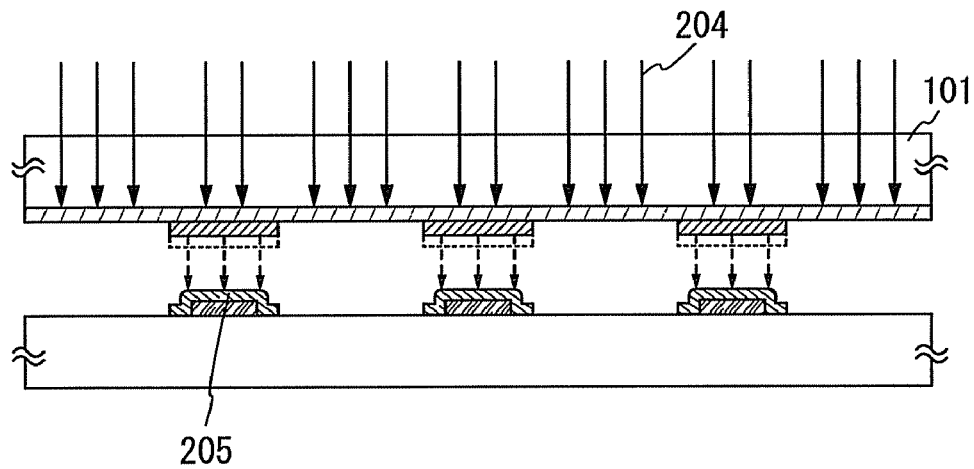
Figure 3B:
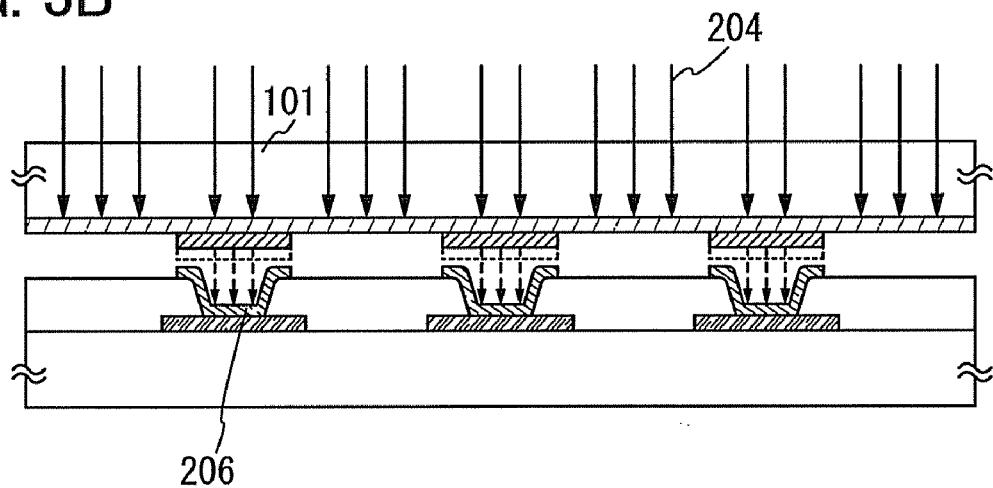

Then, as shown in FIG. 2B, a rear surface of the first substrate 101 (the rear surface at which the light absorption layer 102, the reflective layer 104, and the material layer 105a are not provided) is irradiated with second light 204. With irradiation with the second light 204, heat generated in the light absorption layer 102 is conducted to the reflective layer 104 and the material layer 105a which is overlapped with and adjusted to the reflective layer 104 is heated, whereby the evaporation material in the material layer 105a is evaporated onto the first electrode 202 formed over the second substrate 201. Thus, an EL layer 205 of a light-emitting element can be formed. Note that the same applies to a structure shown in FIGS. 3A to 3C. As shown in FIG. 3B, an EL layer 206 of a light-emitting element is formed over the first electrode 202 formed over the second substrate 201.

The second irradiation light 204, which is used for the irradiation, satisfies a general formula (3), preferably a general formula (4), which are given below, where light intensity is $A_2$ (W/cm$^2$) and irradiation time is $B_2$ (s). Note that the general formula (3) given below is satisfied in a region b (1402) in FIG. 14.

$$1/A_2^{1.5} \leq B_2 \leq 10^6/A_2^{1.5} \text{ and } B_2 \geq 10^{-4}(s) \quad (3)$$

$$10/A_2^{1.5} \leq B_2 \leq 10^5/A_2^{1.5} \text{ and } B_2 \geq 10^{-4}(s) \quad (4)$$

Note that irradiation with the second light in the range of the general formula (3) allows the heat generated in the light absorption layer 102 to be conducted to the reflective layer 104, whereby the material layer 105a which is overlapped with and adjusted to the reflective layer 104 can be evaporated onto the second substrate.

As for the second light 204, a lamp with which a large area can be irradiated at one time is preferably used as its light source. In addition, light irradiation time is preferably long. For example, when a halogen lamp is used, the whole first substrate 101 can be heated to a temperature of 500° C. or higher by irradiation for approximately 7 s, whereby the evaporation material in the material layer 105a or 105b can be sublimated.

In the case where a lamp is used as the light source for the second light 204, a discharge lamp, such as a flash lamp (a xenon flash lamp, a krypton flash lamp, or the like), a xenon lamp, or a metal halide lamp, or an exothermic lamp, such as a halogen lamp or a tungsten lamp, can be used. A flash lamp enables irradiation on a large area for a short time (0.1 milliseconds to 10 milliseconds). In addition, the amount of light which enters the second substrate 201 can also be controlled by changing time interval of light emission. Furthermore, a flash lamp has a long lifetime and consumes less power on standby for light emission; accordingly, running cost can be reduced.

In addition, evaporation by the light irradiation is preferably performed under a reduced-pressure atmosphere. Accordingly, it is preferable that a deposition chamber have a pressure of $5 \times 10^{-3}$ Pa or less, more preferably, $10^{-6}$ Pa to $10^{-4}$ Pa, inclusive.

Note that although the case where the light absorption layer 102 absorbs light from a light source and provides heat to the material layer 105a is described here, it is not limited thereto and radiation heat from irradiation light emitted from a light source may be used. Accordingly, the evaporation material in the material layer 105a may be sublimated not only by light irradiation but also by direct heating with use of a heat source, such as a heater.

Figure 2C:
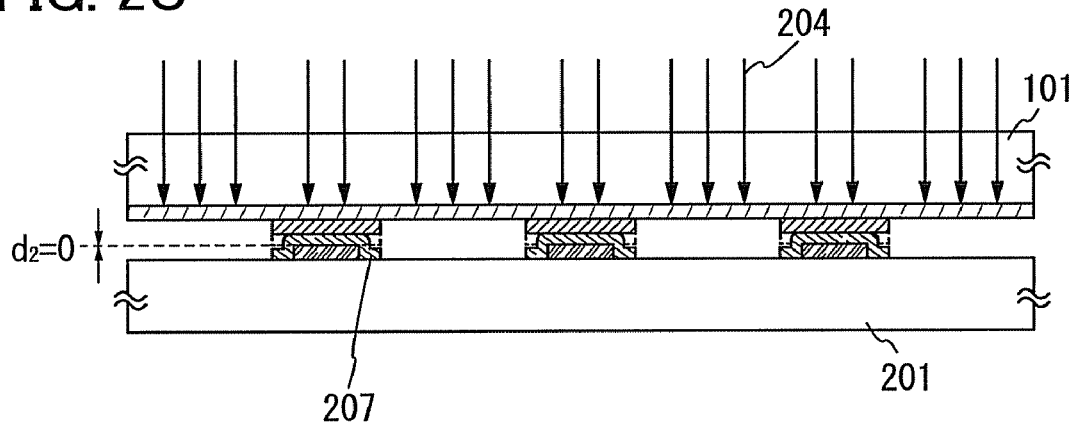
Figure 3C:
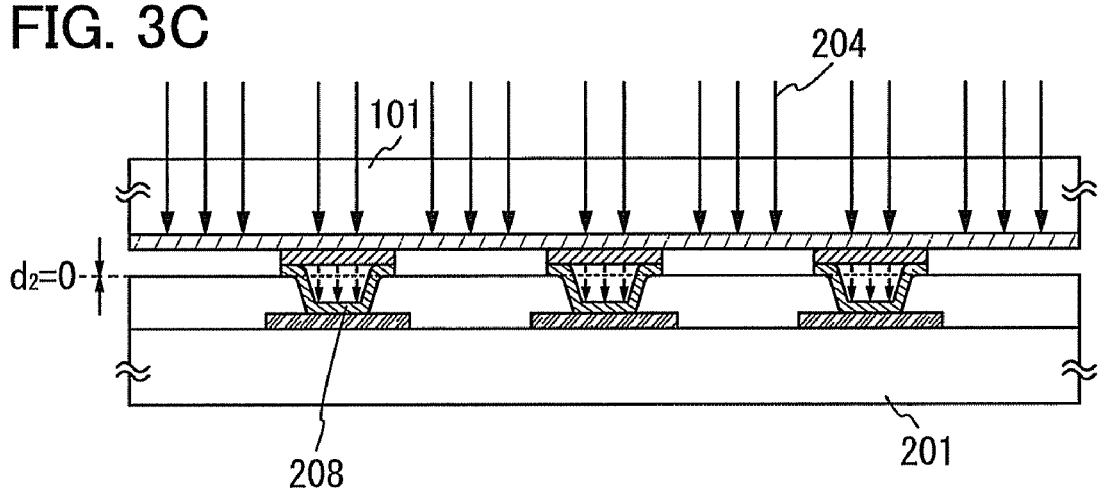

Further, as shown in FIG. 2C, the distance $d_2$ between the first substrate 101 and the second substrate 201 may be set to be 0 μm. That is, the first substrate 101 and the second substrate 201 may be arranged so that the material layer 105a of the first substrate 101 and the surface of the first electrode 202 formed over the second substrate 201 face each other and are in contact with each other. In this manner, reduction in the distance $d_2$ can prevent misplacement of a deposition region, and thus can prevent deformation of a deposition pattern over the deposition target surface. Accordingly, an EL layer 207 of a light-emitting element can be formed over the second substrate 201 with high accuracy. Note that in the case of FIG. 3C where the distance $d_2$ between the first substrate 101 and the second substrate 201 is set to be 0 μm, the surface of the material layer 105b of the first substrate 101 and the surface of the insulator 203 formed over the second substrate 201 are in contact with each other, whereby deformation of the deposition pattern over the deposition target surface due to misplacement of the deposition region can be prevented more effectively. Therefore, an EL layer 208 of the light-emitting element can be formed with high accuracy so as to be in contact with the first electrode 202 over the second substrate 201 as shown in FIG. 3C.

Note that in this embodiment, the case where the second substrate 201 is provided below the first substrate 101 is described; however, the present invention is not limited thereto. The second substrate 201 can be set over the first substrate 101 as appropriate.

In the aforementioned deposition method using the evaporation donor substrate, laser light is used as the first light 107 in the irradiation for the pattern formation of the material layer over the evaporation donor substrate, whereby efficient conversion of the laser light into heat in the light absorption layer can be realized with brief light irradiation. Therefore, the precision of the shape of the material layer 105a formed by the partial sublimation of the evaporation material can be improved.

In addition, by using the second light 204 whose light source is a lamp or the like in evaporating the patterned material layer onto the deposition target substrate, a large area can be irradiated at one time. Therefore, the light absorption layer 102, which is formed on the entire surface of the first substrate 101, can absorb light efficiently, which leads to improvement in deposition efficiency in evaporating the evaporation material onto the deposition target substrate.

Further, the precision of the shape of the layer evaporated onto the deposition target substrate can be improved because the material layer having a desired shape is formed over the evaporation donor substrate due to first light irradiation which partly sublimates the evaporation material, and then the material layer is evaporated onto the deposition target substrate.

Figure 14:
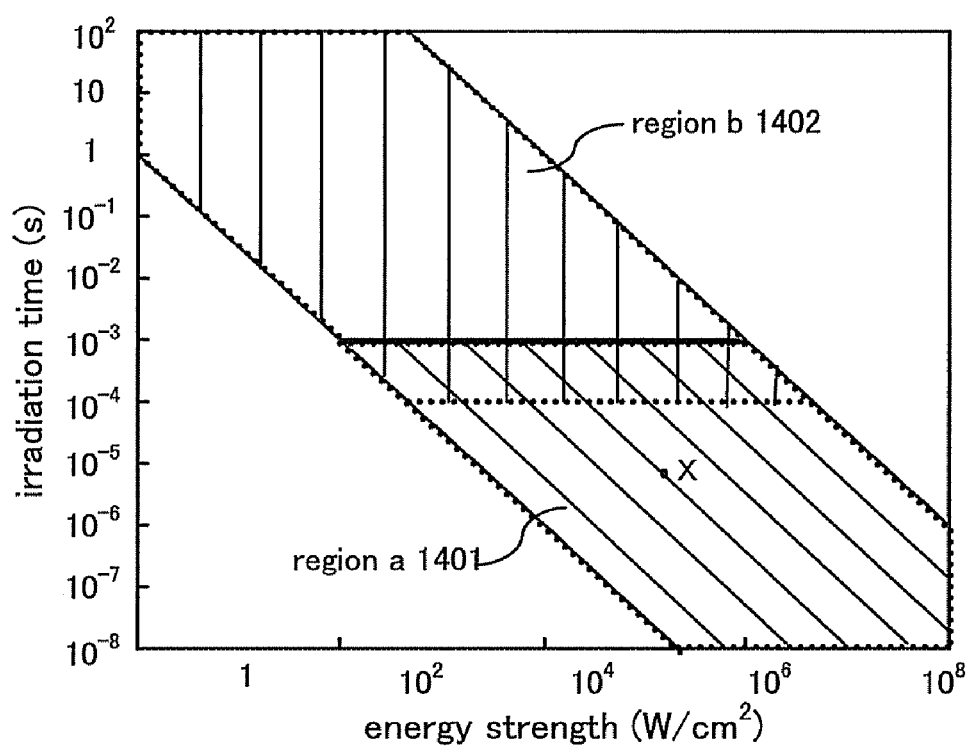
FIG. 14 is a graph showing regions in which conditions for first light and second light are satisfied.

Simulation was performed to calculate change of temperatures of the substrate which was irradiated with the first light under the condition indicated by the X point in FIG. 14. Note that the X point indicates the condition that the irradiation time is 10 μs and the light intensity is $1.2 \times 10^5$ (W/cm$^2$).

Figure 15:
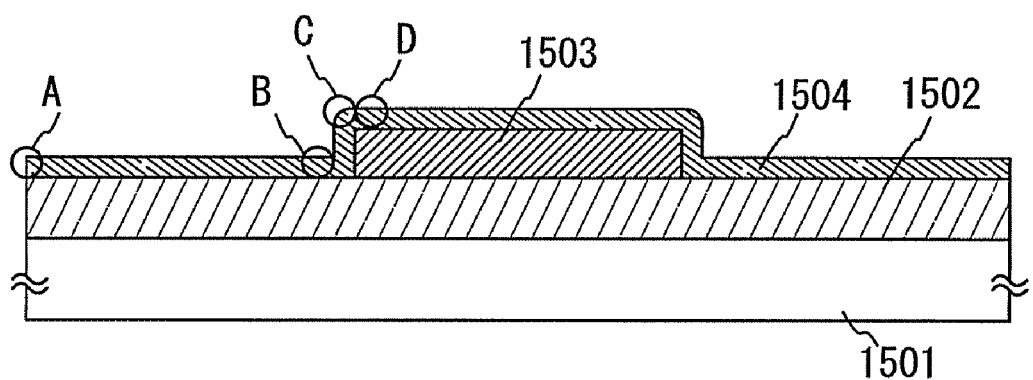
FIG. 15 shows a structure of a substrate which is used in a simulation.

FIG. 15 shows a substrate which is used for the simulation. Note that in FIG. 15, a substrate 1501 is a glass substrate having a thickness of 0.7 mm, an absorption layer 1502 includes Ti and has a thickness of 150 nm, a reflective layer 1503 includes Al and has a thickness of 600 nm and a width of 120 μm, and a material layer 1504 includes an evaporation material and has a thickness of 50 nm.

In the substrate 1501 in FIG. 15, a temperature of a surface of the material layer 1504 on each point which has a different distance from the center of the reflective layer 1503 was calculated by the simulation. Note that in FIG. 15, the points A, B, C, and D have a distance of 200 μm, 60.1 μm, 60.0 μm, and 55.5 μm, respectively, from the center of the reflective layer 1503.

The point A and the point B of the material layer 1504 do not overlap with the reflective layer 1503; therefore, these regions of the material layer 1504 are heated (the region is referred to as a heated region). On the other hand, the point C and the point D of the material layer 1504 overlap or are in contact with the reflective layer 1503; therefore, these regions of the material layer 1504 is not heated (the region is referred to as a non-heated region). Note that the absorption layer 1502 has an absorption rate of 50% and heating value was $6 \times 10^4$ (W/cm$^2$). In addition, the heating value was constant during the irradiation time of 10 μs.

Figure 16:
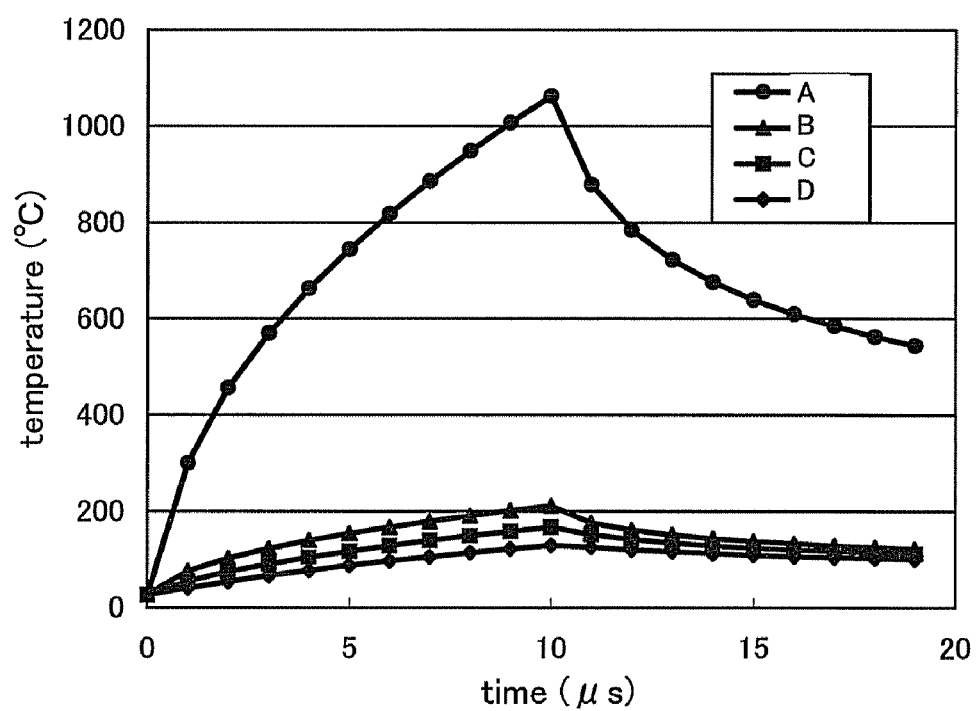
FIG. 16 is a graph showing a simulation result.

FIG. 16 shows the simulation result. The start time of the irradiation is denoted as 0 s. As a result, the maximum temperatures of the points A, B, C, and D were 1063° C., 212° C., 168° C., and 130° C., respectively. Therefore, the difference between the maximum temperatures of the point B and the point C which indicates a boundary between the heated region and the non-heated region in the material layer 1504 was 44° C. From the result, it was found that in the case of irradiating the substrate 1501 with the first light under the condition indicated by the X point, by using an evaporation material whose sublimation temperature is approximately 200° C., only an evaporation material in the heated region is vaporized, whereby the material layer 1504 can be patterned sufficiently.

Embodiment 2

In Embodiment 2, an apparatus is described which is used when an evaporation donor substrate is irradiated with laser light as the first light in a deposition method using the evaporation donor substrate described in Embodiment 1.

Figure 4:
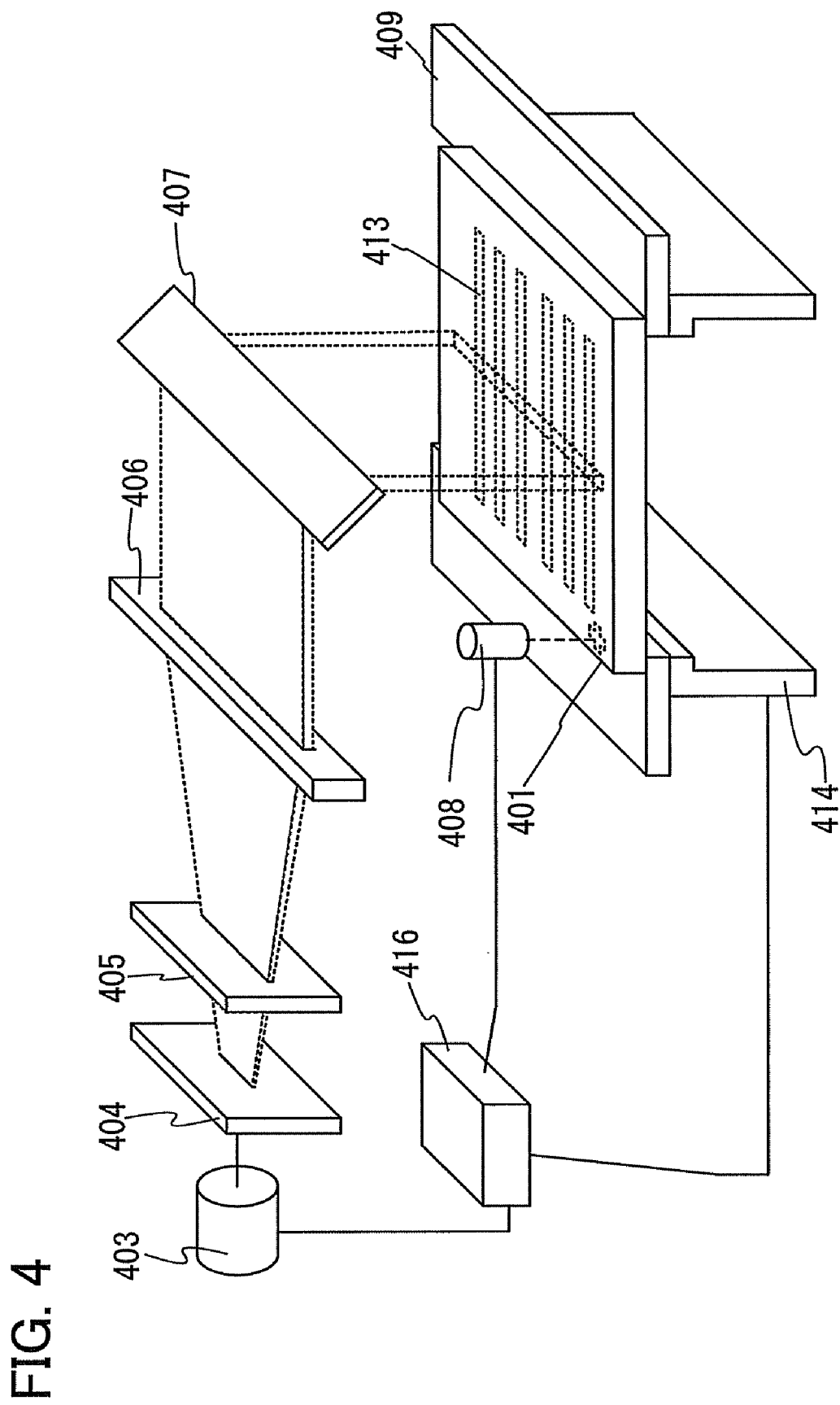
FIG. 4 shows an apparatus in which a laser is used as a light source.

FIG. 4 is a perspective view illustrating an example of an apparatus using laser light. Laser light is outputted from a laser device 403 (a YAG laser device, an excimer laser device, or the like) and transmitted through a first optical system 404 for changing a laser light shape into a rectangular shape, a second optical system 405 for shaping the laser light, and a third optical system 406 for collimating the laser light. Then, an optical path is bent to a direction perpendicular to an evaporation donor substrate which is a first substrate 401 over a first substrate stage 409 by using a reflecting mirror 407. Then, the laser light enters the evaporation donor substrate 401.

Note that the structure of the evaporation donor substrate described in Embodiment 2 is similar to that described in Embodiment 1. That is, the first substrate 401 has the structure in which a reflective layer, a light absorption layer, and a material layer are formed. Note that the reflective layer is formed in a region 413 illustrated with a dotted line in FIG. 4.

Further, the shape of a laser spot on the first substrate 401 preferably has a rectangular shape or a linear shape. Furthermore, in the case of using a large-area substrate, a laser spot preferably has a longer side of 20 cm to 100 cm in order to shorten processing time. Moreover, a plurality of laser devices and optical systems shown in FIG. 4 may be provided so that a substrate with a large area can be processed in a short time. Specifically, laser beams may be emitted from the plurality of laser devices to process divided areas of one substrate.

Note that FIG. 4 shows an example, and there is no particular limitation on a positional relationship between optical systems or an electro-optical element placed in the optical path of the laser light. For example, the reflective mirror 407 is not always needed if the laser device 403 is placed above the first substrate 401 so that laser light is emitted from the laser device 403 in a direction perpendicular to a principle plane of the first substrate 401. Furthermore, an optical system may be a condenser lens, a beam expander, a homogenizer, a polarizer, or the like, and these may be combined. Further, an optical system may be combined with a slit.

By appropriate two-dimensional scanning over a surface to be irradiated in an irradiation region of a laser beam, a wide area of the substrate is irradiated. The scanning is performed by relative movement between the irradiation region of the laser beam and the substrate. Here, a control device 416 controls a moving means (not illustrated) for moving the first substrate stage 409 which holds the first substrate 401, which is an evaporation donor substrate, in the XY direction, whereby scanning is performed. Note that the control device 416 is preferably interlocked so as to also control the laser device 403. Moreover, the control device 416 is preferably interlocked with a position alignment unit 408 which has an imaging device for detecting a position marker.

When the material layer is patterned with use of the apparatus illustrated in FIG. 4, at least the first substrate 401 is placed in a vacuum chamber. Alternatively, all of the components shown in FIG. 4 may be placed in the vacuum chamber.

With use of the apparatus shown in FIG. 4, the material layer over the evaporation donor substrate can be patterned. Further, in this pattern formation, the evaporation material evaporated can be collected to be reused. In that case, manufacturing cost can be reduced.

Note that the structure described in Embodiment 2 can be combined with a structure which is described in Embodiment 1 as appropriate.

Embodiment 3

In Embodiment 3, an apparatus is described which is used in the case where an evaporation donor substrate having a patterned material layer is irradiated with lamp light used as a second light in a deposition method using the evaporation donor substrate described in Embodiment 1.

Figure 5A:
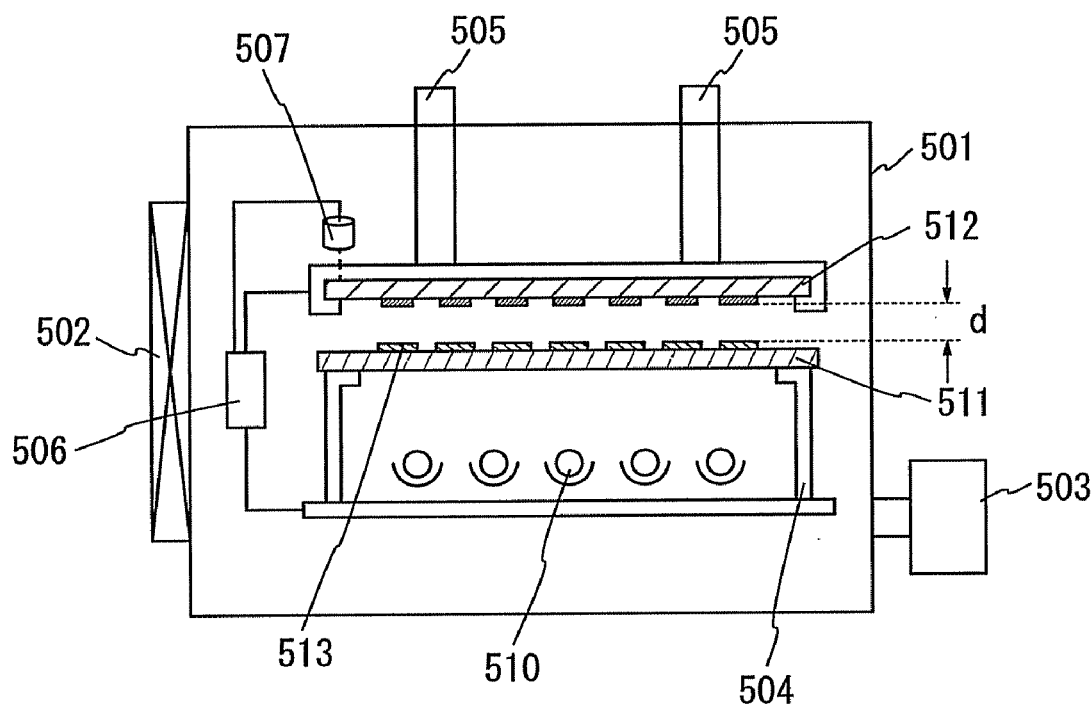
FIGS. 5A and 5B show an apparatus in which a lamp is used as a light source.

In FIG. 5A, a deposition chamber 501 which is a vacuum chamber is interlocked with another process chamber with a gate valve 502 and is provided with an exhaust unit 503. In addition, the deposition chamber 501 is at least provided with a substrate stage 504 for holding a first substrate 511 (including a material layer 513), which is an evaporation donor substrate, a supporting unit 505 to support a substrate for holding a second substrate 512 which is a deposition target substrate, and a light source 510.

Note that a material layer of the first substrate 511 held on the substrate stage 504 is patterned by treatment described in Embodiment 1 or Embodiment 2 which is performed in another processing chamber. That is, after the material layer of the first substrate 511 is patterned in another process chamber, the resulting substrate is transferred to the deposition chamber 501 and set on the substrate stage 504. Further, the second substrate 512, which is a deposition target substrate, is fixed to the supporting unit 505 to support a substrate so that a surface provided with the material layer 513 of the first substrate 511 faces a deposition target surface of the second substrate 512.

Further, by moving the supporting unit 505 to support a substrate, the first substrate 511 and the second substrate 512 are brought closer to each other so that the distance between the first substrate 511 and the second substrate 512 becomes the distance d. Note that the distance d is defined as the distance between the surface of the material layer 513 formed over the first substrate 511 and the surface of the second substrate 512. When some layer (for example, a conductive layer which functions as an electrode or an insulator which functions as a partition) is formed over the second substrate 512, the distance d is defined as the distance between the surface of the material layer 513 over the first substrate 511 and a surface of the layer formed on the second substrate 512. Note that when the surface of the material layer 513 over the first substrate 511 and the surface of the second substrate 512 or the layer over the second substrate 512 has projections and depressions, the distance d is defined as the shortest distance between the surface of the material layer 513 over the first substrate 511 and the outermost surface of the second substrate 512 or the layer formed on the second substrate 512. Specifically, the distance d is 0 μm to 10 μm, inclusive, preferably, 0 mm to 5 μm, inclusive, more preferably, 0 μm to 3 μm, inclusive.

Figure 5B:
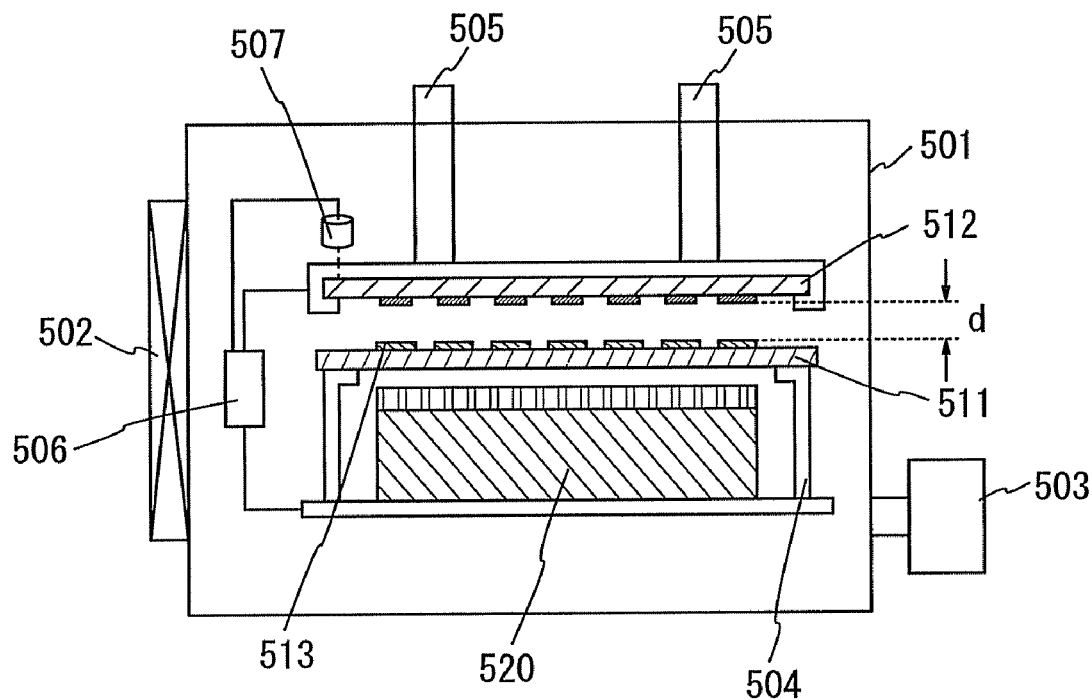

Here, the distance d is 2 μm. In addition, when the second substrate 512 is hard like a quartz substrate and formed of a material which is unlikely to be deformed (warped, bent, or the like), the distance d can be reduced to 0 μm as the minimum distance. Further, although examples in which the substrate stage 504 is fixed while the supporting unit 505 to support a substrate is moved for controlling the distance between the substrates are shown in FIGS. 5A and 5B, a structure may also be employed in which the substrate stage 504 is moved while the supporting unit 505 to support a substrate is fixed. Alternatively, both of the substrate stage 504 and the supporting unit 505 to support a substrate may be moved. Note that FIGS. 5A and 5B show cross sections in a step in which the supporting unit 505 to support a substrate is moved so that the first substrate 511 and the second substrate 512 are brought closer to each other to have the distance d therebetween.

In FIGS. 5A and 5B, the substrate stage 504 and the supporting unit 505 to support a substrate are provided with a moving means (not illustrated) which moves the substrate stage 504 and the supporting unit 505 to support a substrate not only in a vertical direction but also in the XY direction, and precise arrangement is performed by controlling the moving means by a control device 506. Note that the control device 506 is preferably interlocked with a position alignment unit 507 which has an imaging device for detecting a position marker over the substrate (in this case, the second substrate 512). In addition, a sensor for measuring the temperature or humidity inside the deposition chamber 501, or the like may be provided.

Then, a surface of the first substrate 511 which is not provided with the material layer 513 is irradiated with the second light. Accordingly, the material layer 513 which is patterned over the first substrate 511 is heated in a short time, and an evaporation material included in the material layer 513 is sublimated; thus, the evaporation material is deposited onto the deposition target surface (i.e., a lower surface) of the second substrate 512 which is placed so as to face the first substrate 511. In a deposition apparatus in FIGS. 5A and 5B, when the material layer 513 over the first substrate 511 has a uniform and desired thickness in advance, a film with a uniform and desired thickness can be deposited onto the second substrate 512 without providing a thickness monitor. Although a substrate is rotated in a conventional evaporation apparatus, the deposition target substrate is fixed during deposition in the deposition apparatus shown in FIGS. 5A and 5B; thus, this deposition apparatus is suitable for deposition onto a large-area glass substrate which is easily broken. In addition, in the deposition apparatus in FIGS. 5A and 5B, the evaporation donor substrate is also fixed during deposition.

Note that it is preferable that the light source 510 be faced with a large area of the first substrate 511, which is the evaporation donor substrate, for uniform heating.

In order to prevent the material layer 513 over the first substrate 511 for being heated by the light source on standby, an openable and closable shutter used for heat insulation on standby (before an evaporation process) may be provided between the light source 510 and the first substrate 511.

As a lamp which is used for the light source 510, a discharge lamp, such as a flash lamp (a xenon flash lamp, a krypton flash lamp, or the like), a xenon lamp, or a metal halide lamp, or an exothermic lamp, such as a halogen lamp or a tungsten lamp, can be used. A flash lamp is capable of repeatedly emitting very high-intensity light for a short time (0.1 msec to 10 msec) over a large area; thus, heating can be performed uniformly and efficiently regardless of the area of the first substrate. In addition, heating of the first substrate 511 can be controlled by changing time interval of light emission. Furthermore, a flash lamp has a long lifetime and consumes less power on standby for light emission; accordingly, running cost can be reduced. In addition, because a flash lamp facilitates rapid heating, a vertical movement unit, a shutter, and the like in the case of using a heater can be simplified. Thus, further reduction in size of the deposition apparatus can be achieved.

Note that although FIGS. 5A and 5B show an example in which the light source 510 is placed in the deposition chamber 501, a part of an inner wall of the deposition chamber may be made of a light-transmitting member and the light source 510 may be placed outside the deposition chamber. When the light source 510 is placed outside the deposition chamber 501, maintenance such as replacement of light bulbs of the light source 510 can be facilitated.

Further, a unit for controlling the temperature of the second substrate 512 may be provided. In the case where a cooling unit is provided as a unit for controlling the temperature, for example, by providing the supporting unit 505 to support a substrate with a tube through which a heat medium flows and making a refrigerant flow through the tube, the supporting unit 505 to support a substrate can be used as cold plates. Provision of a cooling unit in this manner is useful in the case where different kinds of material layers are stacked. On the other hand, in the case where a heating unit is provided, the supporting unit 505 to support a substrate may be provided with a heating means such as a heater 520. By thus providing a unit for controlling (heating or cooling) the temperature of the second substrate 512, warp or the like of the substrate can also be suppressed.

Note that although FIGS. 5A and 5B show the example of the deposition apparatus employing a face-down system in which the deposition target surface of the second substrate 512 faces downward, a deposition apparatus employing a face-up system in which the deposition surface of the second substrate 512 faces upward can also be used. Further, although FIGS. 5A and 5B show the example of the deposition apparatus employing a system in which the substrate are horizontally placed, a deposition apparatus employing a system in which the substrates are vertically placed can also be used.

By using such a deposition apparatus, the material layer over the evaporation donor substrate can be evaporated onto the deposition target substrate. Note that the material layer over the evaporation donor substrate is patterned in advance; therefore, the evaporation material can be evaporated onto the deposition target substrate with high accuracy.

Note that, by using lamps as light sources, a film can be deposited onto a large area at one time, whereby tact time can be shortened and manufacturing cost of a light-emitting device can be reduced.

Note that the structure described in Embodiment 3 can be combined with a structure which is described in Embodiment 1 or 2 as appropriate.

Embodiment 4

In Embodiment 4, a method for manufacturing a light-emitting device which is capable of full-color display is described. In the method, EL layers of light-emitting elements are formed using a plurality of evaporation donor substrates which are described in Embodiment 1.

In Embodiment 1, through one deposition process, EL layers containing the same kind of material are formed over the second substrate, which is a deposition target substrate. Described in Embodiment 4 is the case where EL layers of three different emission colors are formed over different places of the second substrate.

First, three first substrates each of which is the evaporation donor substrate illustrated in FIG. 1D in Embodiment 1 are prepared. Note that a material layer including an evaporation material for forming an EL layer of a different emission color is formed over each substrate. Specifically, a first substrate (R) having a material layer (R) for forming an EL layer exhibiting red light emission (an EL layer (R)), a first substrate (G) having a material layer (G) for forming an EL layer exhibiting green light emission (an EL layer (G)), and a first substrate (B) having a material layer (B) for forming an EL layer exhibiting blue light emission (an EL layer (B)) are prepared.

In addition, one second substrate which is the deposition target substrate illustrated in FIG. 2A in Embodiment 1 is prepared. Note that a plurality of the first electrodes 202 are formed over the second substrate.

First, the second substrate and the first substrate (R) are superimposed on each other and positioned for a first deposition process as in FIG. 2A. Note that the second substrate is preferably provided with a position marker. In addition, also the first substrate (R) is preferably provided with a position marker. Note that because the first substrate (R) is provided with a light absorption layer, a portion of the light absorption layer near the position marker is preferably removed in advance. Further, the material layer (R) over the first substrate (R) is patterned to be left only at positions which overlap with a reflective layer (R) 601.

Then, a rear surface of the first substrate (R) (the surface on which the light absorption layer 102, the reflective layer 104, and the material layer 105a, which are shown in FIG. 2A, are not formed) is irradiated with light. The light absorption layer 102 absorbs the irradiation light and provides heat which is conducted over a surface of the light absorption layer 102 for the material layer (R), whereby the evaporation material included in the material layer (R) is sublimated. Thus, an EL layer (R) 611 is formed over some of the first electrodes over the second substrate 201. After the first deposition is completed, the first substrate (R) is moved away from the second substrate 201.

Then, the second substrate 201 and the first substrate (G) are superimposed on each other and positioned for a second deposition process. Note that the material layer (G) over the first substrate (G) is formed at a position which is shifted by one pixel from the material layer (R) formed over the first substrate (R), which is used in the first deposition.

Then, a rear surface of the first substrate (G) (the surface on which the light absorption layer 102, the reflective layer 104, and the material layer 105a, which are shown in FIG. 2A, are not formed) is irradiated with light. The light absorption layer 102 absorbs the irradiation light and provides heat which is conducted over a surface of the absorption layer 102 for the material layer (G), whereby the evaporation material included in the material layer (G) is sublimated. Thus, an EL layer (G) 611 is formed over first electrodes which are over the second substrate 201 and which are next to the first electrodes over which the EL layer (R) is formed in the first deposition. After the second deposition is completed, the first substrate (G) is moved away from the second substrate 201.

Then, the second substrate 201 and the first substrate (B) are superimposed on each other and positioned for a third deposition process. Note that the material layer (B) over the first substrate (B) is formed at a position which is shifted by two pixels from the material layer (R) formed over the first substrate (R), which is used in the first deposition.

Figure 6A:
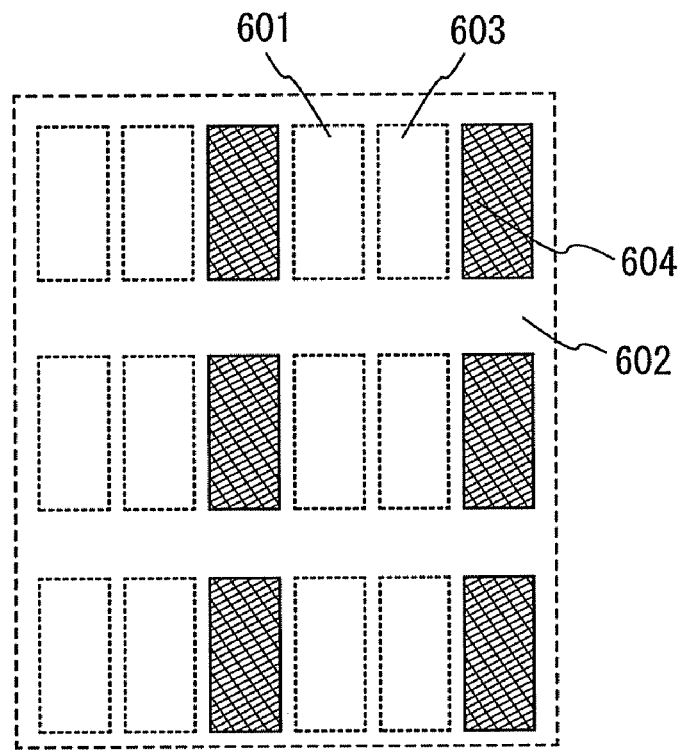
FIGS. 6A and 6B show an evaporation donor substrate and a pixel array of EL layers for full-color display.

Then, a rear surface of the first substrate (B) (the surface on which the light absorption layer 102, the reflective layer 104, and the material layer 105a, which are shown in FIG. 2A, are not formed) is irradiated with light. A state before the third deposition corresponds to a top view of FIG. 6A. In FIG. 6A, the material layer (B) is formed at a position which overlaps with a reflective layer (B) 604, and the light absorption layer 102 absorbs the irradiation light and provides heat which is conducted over a surface of the light absorption layer 102 for the material layer (B), whereby the evaporation material included in the material layer (B) is sublimated. Thus, an EL layer (B) 613 is formed over first electrodes which are over the second substrate 201 and which are next to the first electrodes over which the EL layer (G) is formed in the second deposition. After the third deposition is completed, the first substrate (B) is moved away from the second substrate 201.

In this manner, the EL layer (R) 611, the EL layer (G) 612, and the EL layer (B) 613 can be formed at regular intervals over one second substrate. Then, a second electrode is formed over these films. Thus, light-emitting elements can be formed.

Through the above steps, light-emitting elements which exhibit light emission of different colors are formed over one substrate, whereby a light-emitting device capable of full-color display can be formed.

Figure 6B:
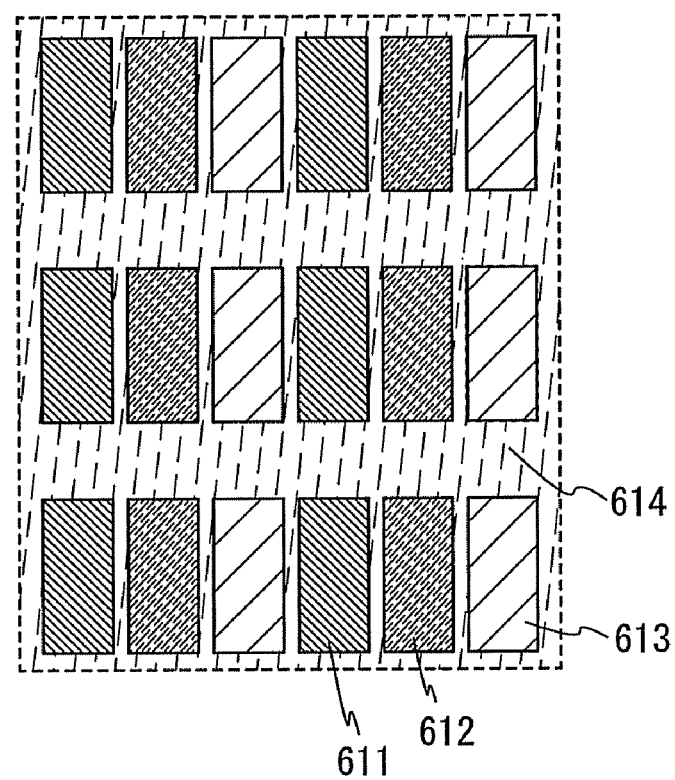

Although FIGS. 6A and 6B show an example in which the reflective layers (the reflective layer (R) 601, a reflective layer (G) 603, and the reflective layer (B) 604) formed over the first substrates, which are evaporation donor substrates, have a rectangular shape, an embodiment of the present invention is not particularly limited to this example. These reflective layers may be successively formed (in a so-called line shape) in the case where neighboring light-emitting regions emit light of the same color. Note that in the case where the reflective layers are formed in a line shape, deposition is performed also between light-emitting regions of the same color; therefore, an insulator or the like is preferably formed between the first electrodes which form the light-emitting regions.

Figure 7A:
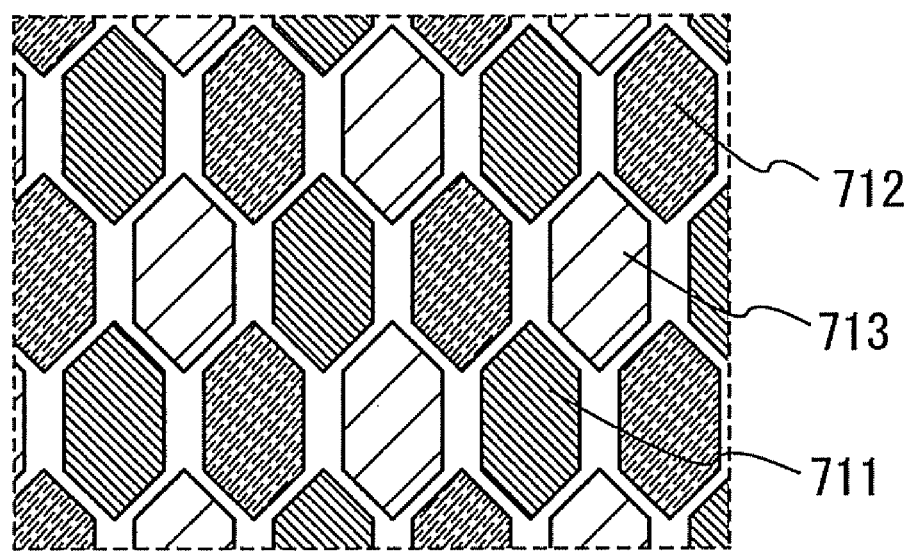
FIGS. 7A and 7B show an evaporation donor substrate and a pixel array of EL layers for full-color display.
Figure 7B:
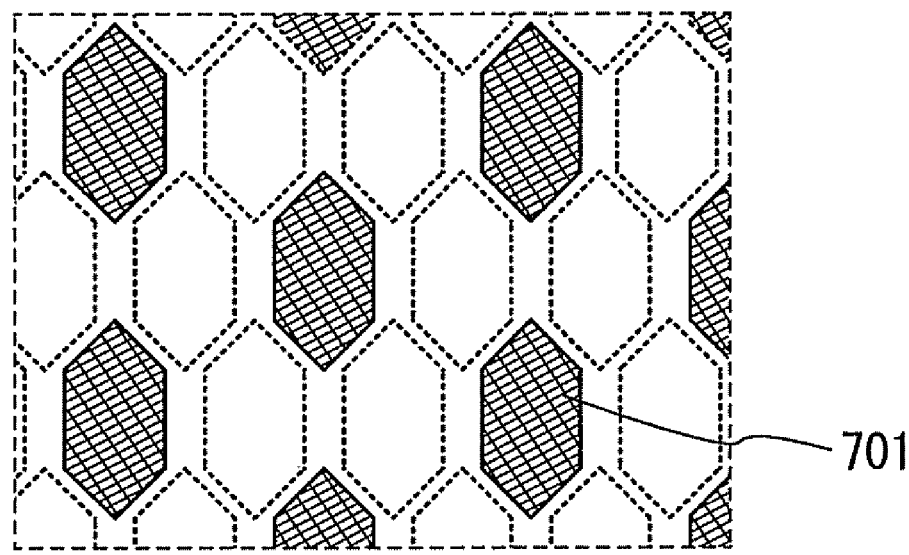

Similarly, there is no particular limitation on the arrangement of pixels. The shape of each pixel may be a polygon such as a hexagon as shown in FIG. 7A, and a full-color light-emitting device may be realized by arrangement of an EL layer (R) 711, an EL layer (G) 712, and an EL layer (B) 713. Note that in order to form polygonal pixels in FIG. 7A, deposition may be performed using the first substrate in FIG. 7B which is provided with the material layer (R) which is patterned to be left at a position overlapping with a polygonal reflective layer 701.

Further, in manufacture of a light-emitting device capable of full-color display described in Embodiment 5, a minute pattern can be formed with high accuracy by the deposition method using the evaporation donor substrate of the present invention. Accordingly, a high-definition light-emitting device can be obtained, and further, the characteristics of the light-emitting device can be improved. In addition, evaporation material which becomes unnecessary after patterning the material layer can be collected and reused; therefore, manufacturing cost of the light-emitting device can be reduced.

Note that the structure described in Embodiment 4 can be combined with a structure which is described in Embodiments 1 to 3 as appropriate.

Embodiment 5

In this embodiment, a method for manufacturing a light-emitting element and a light-emitting device according to the present invention is described.

Figure 8A:
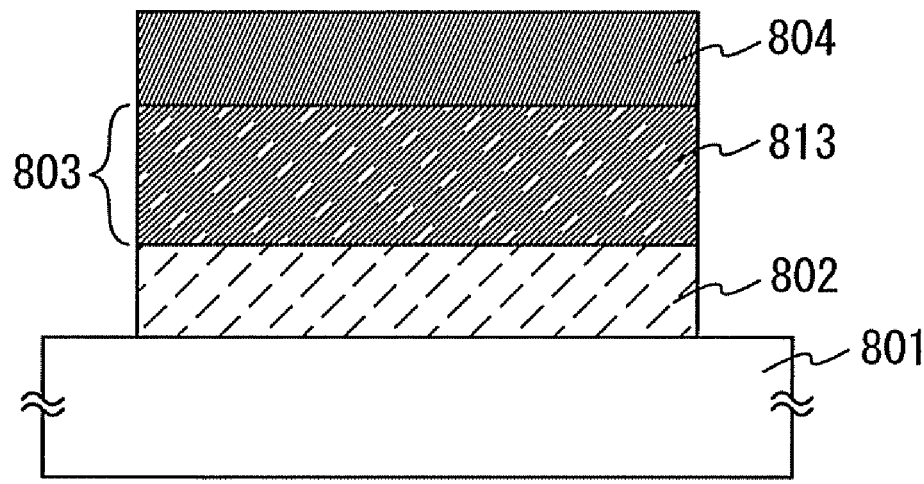
FIGS. 8A and 8B each show a light-emitting element.
Figure 8B:
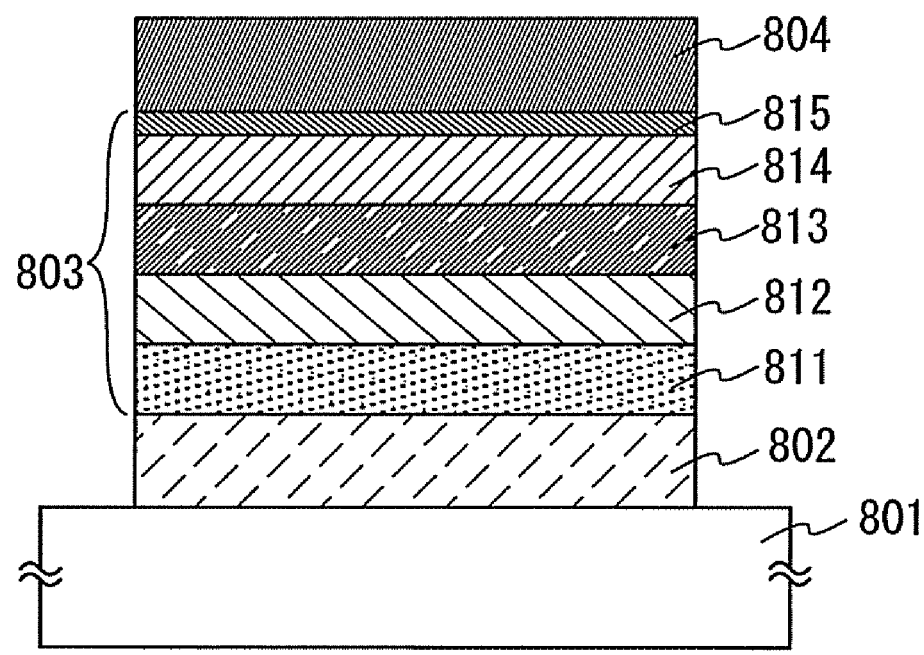

For example, light-emitting elements shown in FIGS. 8A and 8B can be manufactured. In the light-emitting element shown in FIG. 8A, a first electrode 802, an EL layer 803 which includes only a light-emitting layer 813, and a second electrode 804 are stacked in that order over a substrate 801. One of the first electrode 802 and the second electrode 804 functions as an anode, and the other functions as a cathode. Holes injected from the anode and electrons injected from the cathode are recombined in the EL layer 803, whereby light can be emitted from the EL layer 803. In this embodiment, the first electrode 802 functions as the anode and the second electrode 804 functions as the cathode.

In the light-emitting element shown in FIG. 8B, the EL layer 803 in FIG. 8A has a stacked structure including a plurality of layers. Specifically, a hole-injecting layer 811, a hole-transporting layer 812, the light-emitting layer 813, an electron-transporting layer 814, and an electron-injecting layer 815 are provided in that order over the first electrode 802. Note that the EL layer 803 functions as a light emitting layer as long as it includes at least the light-emitting layer 813 as in FIG. 8A; therefore, all of the above layers are not always necessary and may be selected as appropriate to be provided as needed.

As the substrate 801 in FIGS. 8A and 8B, a substrate having an insulating surface or an insulating substrate is employed. Specific examples of the substrate include various types of glass substrates that are used in the electronics industry, such as an aluminosilicate glass substrate, an alumino-borosilicate glass substrate, or a barium borosilicate glass substrate; a quartz substrate; a ceramic substrate; and a sapphire substrate.

For the first electrode 802 and the second electrode 804, any of various types of metals, alloys, electrically conductive compounds, mixtures thereof, and the like can be used. Specific examples are given below: indium tin oxide (ITO), indium tin oxide containing silicon or silicon oxide, indium zinc oxide (IZO), and indium oxide containing tungsten oxide and zinc oxide. Further, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used.

A film of any of those materials is generally formed by a sputtering method. For example, a film of indium zinc oxide can be formed by a sputtering method using a target in which zinc oxide is added to indium oxide at 1 wt % to 20 wt %. A film of indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively. Further, a film of any of those materials may be formed by an inkjet method, a spin coating method, or the like by application of a sol-gel process or the like.

Further, aluminum (Al), silver (Ag), an alloy containing aluminum, or the like can be used. Moreover, any of the following materials having a low work function value can be used: elements which belong to Group 1 and Group 2 of the periodic table, that is, alkali metals such as lithium (Li) and cesium (Cs) and alkaline-earth metals such as magnesium (Mg), calcium (Ca), and strontium (Sr), and alloys thereof (an alloy of aluminum, magnesium, and silver, and an alloy of aluminum and lithium); rare earth metals such as europium (Eu) and ytterbium (Yb), and alloys thereof; and the like.

A film of an alkali metal, an alkaline earth metal, and an alloy thereof can be formed by a vacuum evaporation method. A film of an alloy containing an alkali metal or an alkaline earth metal can be formed by a sputtering method. Further, a film of a silver paste or the like can be formed by an ink-jet method or the like. The first electrode 802 and the second electrode 804 are not limited to a single-layer film and can be formed as a stacked-layer film.

Note that in order to extract light emitted from the EL layer 803 to the outside, one or both of the first electrode 802 and the second electrode 804 are formed so as to transmit light. For example, one or both of the first electrode 802 and the second electrode 804 are formed using a conductive material having a light-transmitting property, such as indium tin oxide, or formed using silver, aluminum, or the like with a thickness of several nanometers to several tens of nanometers. Alternatively, one or both of the first electrode 802 and the second electrode 804 can have a stacked-layer structure including a thin film of a metal such as silver, aluminum, or the like with a reduced thickness and a thin film of a conductive material having a light-transmitting property, such as ITO.

Note that the EL layer 803 (the hole-injecting layer 811, the hole-transporting layer 812, the light-emitting layer 813, the electron-transporting layer 814, or the electron-injecting layer 815) of the light-emitting element of this embodiment can be formed by application of a deposition method which is described in Embodiments 1 to 4.

For example, in the case where the light-emitting element shown in FIG. 8A is formed, a material layer of the evaporation donor substrate described in Embodiment 1 is formed using a material which forms the EL layer 803 and the EL layer 803 is formed over the first electrode 802 over the substrate 801 using the evaporation donor substrate. Then, the second electrode 804 is formed over the EL layer 803, whereby the light-emitting element in FIG. 8A can be obtained.

Any of a variety of materials can be used for the light-emitting layer 813. For example, a fluorescent compound which exhibits fluorescence or a phosphorescent compound which exhibits phosphorescence can be used.

Examples of a phosphorescent compound which is used for the light-emitting layer 813 are given below. As a material for blue light emission, bis[2-(4',6'-difluorophenyl)pyridinato-N,$C^{2'}$]iridium(III)tetrakis(1-pyrazolyl)borate (abbr.: FIr6), bis[2-(4',6'-difluorophenyl)pyridinato-N,$C^{2'}$]iridium(III)picolinate (abbr.: FIrpic), bis[2-(3',5'bistrifluoromethylphenyl) pyridinato-N,$C^{2'}$]iridium(III)picolinate (abbr.: Ir(CF$_3$ppy)$_2$ (pic)), bis[2-(4',6'-difluorophenyl)pyridinato-N,$C^{2'}$]iridium (III)acetylacetonate (abbr.: FIracac) or the like can be given. As a material for green light emission, tris(2-phenylpyridinato-N,$C^{2'}$)iridium(III) (abbr.: Ir(ppy)$_3$), bis[2-phenylpyridinato-N,$C^{2'}$]iridium(III)acetylacetonate (abbr.: Ir(ppy)$_2$ (acac)), bis(1,2-diphenyl-1H-benzimidazolato)iridium(III) acetylacetonate (abbr.: Ir(pbi)$_2$(acac)), bis(benzo[h] quinolinato)iridium(III)acetylacetonate (abbr.: Ir(bzq)$_2$ (acac)), or the like can be given. As a material for yellow light emission, bis(2,4-diphenyl-1,3-oxazolato-N,$C^{2'}$)iridium(III) acetylacetonate (abbr.: Ir(dpo)$_2$(acac)), bis[2-(4'-perfluorophenylphenyl)pyridinato]iridium(III)acetylacetonate (abbr.: Ir(p-PF-ph)$_2$(acac)), bis(2-phenylbenzothiazolato-N, $C^{2'}$)iridium(III)acetylacetonate (abbr.: Ir(bt)$_2$(acac)), or the like can be given. As a material for orange light emission, tris(2-phenylquinolinato-N,$C^{2'}$)iridium(III) (abbr.: Ir(pq)$_3$), bis(2-phenylquinolinato-N,$C^{2'}$)iridium(III)acetylacetonate (abbr.: Ir(pq)$_2$(acac)), or the like can be given. As a material for red light emission, an organometallic complex such as bis[2-(2'-benzo[4,5-a]thienyl)pyridinato-N,$C^{3'}$]iridium(III) acetylacetonate (abbr.: Ir(btp)$_2$(acac)), bis(1-phenylisoquinolinato-N,$C^{2'}$)iridium(III)acetylacetonate (abbr.: Ir(piq)$_2$(acac)), (acetylacetonato)bis[2,3-bis(4-fluorophenyl) quinoxalinato]iridium(III) (abbr.: Ir(Fdpq)$_2$(acac)), 2,3,7,8, 12,13,17,18-octaethyl-21H,23H -porphyrinatoplatinum(III) (abbr.: PtOEP), or the like can be given. In addition, a rare earth metal complex such as tris(acetylacetonato) (monophenanthroline)terbium(III) (abbr.: Tb(acac)$_3$(Phen)), tris(1,3-diphenyl-1,3-propanedionato)(monophenanthroline)europium(III) (abbr.: Eu(DBM)$_3$(Phen)), or tris[1-(2-thenoyl)-3,3,3-trifluoroacetonato](monophenanthroline)europium(III) (abbr.: Eu(TTA)$_3$(Phen)) exhibits light emission from a rare earth metal ion (electron transition between different multiplicities); therefore, such a rare earth metal complex can be used as a phosphorescent compound.

Examples of a fluorescent compound which is used for the light-emitting layer 813 are given below. As a material for blue light emission, N,N'-bis[4-(9H-carbazol-9-yl)phenyl]-N,N'-diphenylstilbene-4,4'-diamine (abbr.: YGA2S), 4-(9H-carbazol-9-yl)-4'-(10-phenyl-9-anthryl)triphenylamine (abbr.: YGAPA), or the like can be given. As a material for green light emission, N-(9,10-diphenyl-2-anthryl)-N,9-diphenyl-9H-carbazol-3-amine (abbreviation, 2PCAPA), N-[9,10-bis(1,1'-biphenyl-2-yl)-2-anthryl]-N,9-diphenyl-9H-carbazol-3-amine (abbr.: 2PCABPhA), N-(9,10-diphenyl-2-anthryl)-N,N',N'-triphenyl-1,4-phenylenediamine (abbr.: 2DPAPA), N-[9,10-bis(1,1'-biphenyl-2-yl)-2-anthryl]-N,N',N'-triphenyl-1,4-phenylenediamine (abbr.: 2DPABPhA) 9,10-bis(1,1'-biphenyl-2-yl)-N-[4-(9H-carbazol-9-yl)phenyl]-N-phenylanthracen-2-amine (abbr.: 2YGABPhA), N,N,9-triphenylanthracen-9-amine (abbr.: DPhAPhA), or the like can be given. As a material for yellow light emission, rubrene, 5,12-bis(1,1'-biphenyl-4-yl)-6,11-diphenyltetracene (abbr.: BPT), or the like can be given. As a material for red light emission, N,N,N',N'-tetrakis(4-methylphenyl)tetracene-5,11-diamine (abbr.: p-mPhTD), 7,13-diphenyl-N,N,N',N'-tetrakis(4-methylphenyl)acenaphtho[1, 2-a]fluoranthene-3,10-diamine (abbr.: p-mPhAFD), or the like can be given.

The light-emitting layer 813 may have a structure in which a substance having a high light-emitting property (a dopant material) is dispersed in another substance (a host material), whereby crystallization of the light-emitting layer can be suppressed. In addition, concentration quenching of the light-emitting layer 813 which results from high concentration of the substance having a high light-emitting property can be suppressed.

As the substance in which the substance having a high light-emitting property is dispersed, when the substance having a high light-emitting property is a fluorescent compound, a substance having higher singlet excitation energy (the energy difference between a ground state and a singlet excited state) than the fluorescent compound is preferably used. When the substance having a high light-emitting property is a phosphorescent compound, a substance having higher triplet excitation energy (the energy difference between a ground state and a triplet excited state) than the phosphorescent compound is preferably used.

Examples of host materials used for the light-emitting layer 813 are given below: 4,4'-bis[N-(1-naphthyl)-N-phenylamino]biphenyl (abbr.: NPB), tris(8-quinolinolato)aluminum(III) (abbr.: Alq), 4,4'-bis[N-(9,9-dimethylfluoren-2-yl)-N-phenylamino]biphenyl (abbr.: DFLDPBi), bis(2-methyl-8-quinolinolato)(4-phenylphenolato)aluminum(III) (abbr.: BAlq), 4,4'-di(9-carbazolyl)biphenyl (abbr.: CBP), 2-tert-butyl-9,10-di(2-naphthyl)anthracene (abbr.: t-BuDNA), and 9-[4-(9-carbazolyl)phenyl]-10-phenylanthracene (abbr.: CzPA).

As the dopant material, any of the above-mentioned phosphorescent compounds and fluorescent compounds can be used.

When the light-emitting layer 813 has a structure in which a substance having a high light-emitting property (a dopant material) is dispersed in another substance (a host material), a mixed layer of a host material and a guest material is formed as the material layer over the evaporation donor substrate. Alternatively, the material layer over the evaporation donor substrate may have a structure in which a layer containing a host material and a layer containing a dopant material are stacked. By forming the light-emitting layer 813 using an evaporation donor substrate with the material layer having such a structure, the light-emitting layer 813 contains a substance in which a light-emitting material is dispersed (a host material) and a substance having a high light-emitting property (a dopant material), and has a structure in which the substance having a high light-emitting property (the dopant material) is dispersed in the substance in which a light-emitting material is dispersed (the host material). Note that for the light-emitting layer 813, two or more kinds of host materials and a dopant material may be used, or two or more kinds of dopant materials and a host material may be used. Alternatively, two or more kinds of host materials and two or more kinds of dopant materials may be used.

In the case where the light-emitting element shown in FIG. 8B is formed, an evaporation donor substrate described in Embodiment 1 which has a material layer for forming a layer (the hole-injecting layer 811, the hole-transporting layer 812, the electron-transporting layer 814, or the electron-injecting layer 815) included in the EL layer 803 is prepared for each layer, and deposition of each layer is performed using a different evaporation donor substrate by the method described in Embodiment 1, whereby the EL layer 803 is formed over the first electrode 802 over the substrate 801. Then, the second electrode 804 is formed over the EL layer 803, whereby the light-emitting element in FIG. 8B can be obtained. Note that although all the layers in the EL layer 803 can be formed by the method described in Embodiment 1 in this case, only some of the layers in the EL layer 803 may be formed by the method described in Embodiment 1.

For example, the hole-injecting layer 811 can be formed using molybdenum oxide, vanadium oxide, ruthenium oxide, tungsten oxide, manganese oxide, or the like. Alternatively, the hole-injecting layer 811 can be formed using a phthalocyanine-based compound such as phthalocyanine (abbr.: $H_2Pc$) or copper phthalocyanine (abbr.: CuPc), a high molecular compound such as poly(3,4-ethylenedioxythiophene)/poly(styrenesulfonate) (PEDOT/PSS), or the like.

As the hole-injecting layer 811, a layer which contains a substance having a high hole-transporting property and a substance having an electron-accepting property can be used. The layer which contains a substance having a high hole-transporting property and a substance having an electron-accepting property has a high carrier density and an excellent hole-injecting property. When the layer which contains a substance having a high hole-transporting property and a substance having an electron-accepting property is used as a hole-injecting layer which is in contact with an electrode that functions as an anode, a material of the electrode that functions as an anode can be selected from any of a variety of metals, alloys, electrically conductive compounds, mixtures thereof, and the like can be used for the electrode regardless of the value of the work function.

The layer which contains a substance having a high hole-transporting property and a substance having an electron-accepting property can be formed using, for example, an evaporation donor substrate having a material layer which is a stack of a layer containing a substance having a high hole-transporting property and a layer containing a substance having an electron-accepting property.

Examples of the substance having an electron-accepting property which is used for the hole-injecting layer 811 are given below: 7,7,8,8-tetracyano-2,3,5,6-tetrafluoroquinodimethane (abbr.: F4-TCNQ), chloranil, and the like. Other examples include a transition metal oxide. Still other examples include oxide of metals belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among them, molybdenum oxide is especially preferable because molybdenum oxide is stable also in the atmosphere and has a low hygroscopic property, and therefore, can be easily handled.

As the substance having a high hole-transporting property which is used for the hole-injecting layer 811, any of various compounds such as an aromatic amine compound, a carbazole derivative, an aromatic hydrocarbon, and a high molecular compound (such as an oligomer, a dendrimer, and a polymer) can be used. Note that it is preferable that the substance having a high hole-transporting property used for the hole-injecting layer be a substance having a hole mobility of $10^{-6}$ $cm^2/Vs$ or higher. However, any other material whose hole-transporting property is higher than its electron-transporting property may be used. Specific examples of the substance having a high hole-transporting property which can be used for the hole-injecting layer 811 are given below.

Examples of an aromatic amine compound which can be used for the hole-injecting layer 811 are given below: 4,4'-bis[N-(1-naphthyl)-N-phenylamino]biphenyl (abbr.: NPB), N,N'-bis(3-methylphenyl)-N,N'-diphenyl-[1,1'-biphenyl]-4,4'-diamine (abbr.: TPD), 4,4',4''-tris(N,N-diphenylamino)triphenylamine (abbr.: DATA), 4,4',4''-tris[N-(3-methylphenyl)-N-phenylamino]triphenylamine (abbr.: MTDATA), and 4,4'-bis[N-(spiro-9,9'-bifluoren-2-yl)-N-phenylamino]biphenyl (abbr.: BSPB). Other examples are as follows: N,N-bis(4-methylphenyl)(p-tolyl)-N,N'-diphenyl-p-phenylenediamine (abbr.: DTDPPA), 4,4'-bis[N-(4-diphenylaminophenyl)-N-phenylamino]biphenyl (abbr.: DPAB), 4,4'-bis(N-4-[N'-(3-methylphenyl)-N'-phenylamino]phenyl-N -phenylamino)biphenyl (abbr.: DNTPD), and 1,3,5-tris[N-(4-diphenylaminophenyl)-N-phenylamino]benzene (abbr.: DPA3B).

Specific examples of a carbazole derivative which can be used for the hole-injecting layer 811 are given below: 3-[N-(9-phenylcarbazol-3-yl)-N-phenylamino]-9-phenylcarbazole (abbr.: PCzPCA1), 3,6-bis[N-(9-phenylcarbazol-3-yl)-N-phenylamino]-9-phenylcarbazole (abbr.: PCzPCA2), and 3-[N-(1-naphthyl)-N-(9-phenylcarbazol-3-yl)amino]-9-phenylcarbazole (abbr.: PCzPCN1).

Other examples of a carbazole derivative which can be used for the hole-injecting layer 811 are given below: 4,4'-di(N-carbazolyl)biphenyl (abbr.: CBP), 1,3,5-tris[4-(N-carbazolyl)phenyl]benzene (abbr.: TCPB), 9-[4-(10-phenyl-9-anthryl)phenyl]-9H-carbazole (abbr.: CzPA), and 1,4-bis-[4-(N-carbazolyl)phenyl]-2,3,5,6-tetraphenylbenzene.

Examples of an aromatic hydrocarbon which can be used for the hole-injecting layer 811 are given below: 2-tert-butyl-9,10-di(2-naphthyl)anthracene (abbr.: t-BuDNA), 2-tert-butyl-9,10-di(1-naphthyl)anthracene, 9,10-bis(3,5-diphenylphenyl)anthracene (abbr.: DPPA), 2-tert-butyl-9,10-bis(4-phenylphenyl)anthracene (abbr.: t -BuDBA), 9,10-di(2-naphthyl)anthracene (abbr.: DNA), 9,10-diphenylanthracene (abbr.: DPAnth), 2-tert-butylanthracene (abbr.: t-BuAnth), 9,10-bis(4-methyl-1-naphthyl)anthracene (abbr.: DMNA), 9,10-bis[2-(1-naphthyl)phenyl]-2-tert-butyl -anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Besides, pentacene, coronene, or the like can also be used. As these aromatic hydrocarbons listed here, it is preferable that an aromatic hydrocarbon having a hole mobility of $1\times10^{-6}$ $cm^2/Vs$ or higher and having 14 to 42 carbon atoms be used.

Note that an aromatic hydrocarbon which can be used for the hole-injecting layer 811 may have a vinyl skeleton. Examples of an aromatic hydrocarbon having a vinyl group are given below: 4,4'-bis(2,2-diphenylvinyl)biphenyl (abbr.: DPVBi), and 9,10-bis[4-(2,2-diphenylvinyl)phenyl]anthracene (abbr.: DPVPA).

The hole-injecting layer 811 can be formed by using an evaporation donor substrate having a material layer which is a stack of a layer containing a substance having a high hole-transporting property and a layer containing a substance having an electron-accepting property. When metal oxide is used as the substance having an electron-accepting property, it is preferable that a layer which contains the metal oxide be formed after the layer which contains a substance having a high hole-transporting property is formed over the first substrate 801. This is because, in many cases, metal oxide has a higher decomposition temperature or evaporation temperature than a substance having a high hole-transporting property. The evaporation source with such a structure makes it possible to efficiently sublimate a substance having a high hole-transporting property and metal oxide. In addition, local non-uniformity of concentration of the metal oxide in a deposited film formed by evaporation can be suppressed. Further, there are few kinds of solvents which allow both a substance having a high hole-transporting property and metal oxide to be dissolved or dispersed therein, and a mixed solution to dissolve or disperse the both substances is not easily formed; therefore, it is difficult to directly form a mixed layer by a wet method. However, the use of the deposition method of the present invention makes it possible to easily form a mixed layer which contains a substance having a high hole-transporting property and metal oxide.

In addition, the layer which contains a substance having a high hole-transporting property and a substance having an electron-accepting property is excellent in not only a hole-injecting property but also a hole-transporting property, and thus the above-described hole-injecting layer 811 may be used as the hole-transporting layer.

The hole-transporting layer 812 is a layer which contains a substance having a high hole-transporting property. Examples of the substance having a high hole-transporting property are given below: an aromatic amine compound such as 4,4'-bis[N-(1-naphthyl)-N-phenylamino]biphenyl (abbr.: NPB or a-NPD), N,N'-bis(3-methylphenyl)-N,N'-diphenyl-[1,1'-biphenyl]-4,4'-diamine (abbr.: TPD), 4,4',4"-tris(N,N-diphenylamino)triphenylamine (abbr.: TDATA), 4,4',4"-tris[N-(3-methylphenyl)-N-phenylamino]triphenylamine (abbr.: MTDATA), and 4,4'-bis[N-(spiro-9,9'-bifluoren-2-yl)-N-phenylamino]biphenyl (abbr.: BSPB). Most of the substances mentioned here have a hole mobility of $10^{-6}$ cm$^2$/Vs or higher. However, any other material whose hole-transporting property is higher than its electron-transporting property may be used. Note that the layer which contains a substance having a high hole-transporting property is not limited to a single layer and may be a stacked layer of two or more layers formed using the above-mentioned substances.

The electron-transporting layer 814 is a layer which contains a substance having a high electron-transporting property. Examples thereof are given below: metal complexes having a quinoline skeleton or a benzoquinoline skeleton, such as tris(8-quinolinolato)aluminum (abbr.: Alq), tris(4-methyl-8-quinolinolato)aluminum (abbr.: Almq$_3$), bis(10-hydroxybenzo[h]quinolinato)beryllium (abbr.: BeBq$_2$), and bis(2-methyl-8-quinolinolato)(4-phenylphenolato)aluminum (abbr.: BAlq). Other examples are metal complexes having an oxazole-based ligand or a thiazole-based ligand, such as bis[2-(2-hydroxyphenyl)benzoxazolato]zinc (abbr.: Zn(BOX)$_2$), and bis[2-(2-hydroxyphenyl)benzothiazolato]zinc (abbr.: Zn(BTZ)$_2$). Besides metal complexes, other examples are given below: 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-biphenylyl)-4-phenyl-5-(4-tert-butylphenyl)-1,2,4-triazole (abbr.: TAZ01), bathophenanthroline (abbr.: BPhen), and bathocuproine (abbr.: BCP). Most of the substances mentioned here have an electron mobility of $10^{-6}$ cm$^2$/Vs or higher. Note that any other material that has an electron-transporting property higher than a hole-transporting property may be used for the electron-transporting layer. The electron-transporting layer is not limited to a single layer and may be a stacked layer of two or more layers formed using the above-mentioned substances.

The electron-injecting layer 815 can be formed using an alkali metal compound or an alkaline earth metal compound, such as lithium fluoride (LiF), cesium fluoride (CsF), or calcium fluoride (CaF$_2$). Further, a layer in which a substance having an electron-transporting property is combined with an alkali metal or an alkaline earth metal can be employed. For example, a layer of Alq containing magnesium (Mg) can be used. Note that it is more preferable that the layer in which a substance having an electron-transporting property is combined with an alkali metal or an alkaline earth metal be used as the electron-injecting layer because electrons are efficiently injected from the second electrode 804.

Note that there is no particular limitation on a stacked-layer structure of layers in the EL layer 803. The EL layer 803 may be formed by an appropriate combination of a light-emitting layer with a layer containing a substance having a high electron-transporting property, a substance having a high hole-transporting property, a substance having a high electron-injecting property, a substance having a high hole-injecting property, a bipolar substance (a substance having high electron-transporting and hole-transporting properties), or the like.

Light emission from the EL layer 803 is extracted to the outside through one or both of the first electrode 802 and the second electrode 804. Therefore, one or both of the first electrode 802 and the second electrode 804 have a light-transmitting property. In the case where only the first electrode 802 has a light-transmitting property, light is extracted from the substrate 801 side through the first electrode 802. In the case where only the second electrode 804 has a light-transmitting property, light is extracted from the side opposite to the substrate 801 through the second electrode 804. In the case where both the first electrode 802 and the second electrode 804 have a light-transmitting property, light is extracted from both the substrate 801 side and the side opposite to the substrate 801 through the first electrode 802 and the second electrode 804, respectively.

Note that although FIGS. 8A and 8B show the structure in which the first electrode 802 serving as an anode is provided on the substrate 801 side, the second electrode 804 serving as a cathode may be provided on the substrate 801 side.

Further, the EL layers 803 are formed by the deposition method described in Embodiment 1 or may be formed by a combination of the deposition method described in Embodiments 1 to 4 with another deposition method. Further, the EL layers 803 may be formed by using a different film formation method in each electrode or each film. Examples of a dry method are a vacuum evaporation method, an electron beam evaporation method, and a sputtering method. Examples of a wet method are an ink-jet method and a spin coating method.

In a light-emitting element of Embodiment 5, an EL layer can be formed using evaporation donor substrate according to the present invention. Accordingly, a highly accurate film can be formed efficiency. Therefore, not only improvement in characteristics of the light-emitting element, but also improvement in yield and a reduction in cost can be achieved.

Embodiment 6

In Embodiment 6, a light-emitting device which is formed using the light-emitting element described in Embodiment 5 is described.

First, a passive-matrix light-emitting device is described with reference to FIGS. 9A to 9C and FIG. 10.

In a passive-matrix (also called simple-matrix) light-emitting device, a plurality of anodes arranged in stripes (in stripe form) are provided to be perpendicular to a plurality of cathodes arranged in stripes. A light-emitting layer is interposed at each intersection. Therefore, a pixel at an intersection of an anode which is selected (to which voltage is applied) and a cathode which is selected emits light.

FIG. 9A is a top view of a pixel portion before sealing. FIG. 9B is a cross-sectional view taken along dashed line A-A' in FIG. 9A. FIG. 9C is a cross-sectional view taken along dashed line B-B' in FIG. 9A.

Over a substrate 901, an insulating layer 904 is formed as a base insulating layer. Note that the base insulating layer may not be provided if not necessary. A plurality of first electrodes 913 are arranged in stripes at regular intervals over the insulating layer 904. In addition, on the first electrode 913, a partition 914 having an opening in which each pixel is provided, the partition 914 having openings is formed using an insulator (a photosensitive or nonphotosensitive organic material (polyimide, acrylic, polyamide, polyimide amide, resist, or benzocyclobutene) or an SOG film (for example, a $SiO_x$ film) including an alkyl group). Note that the opening corresponding to a pixel region serves as a light-emitting region 921.

Over the partition 914 having openings, a plurality of inversely tapered partitions 922 which are parallel to one another are provided to intersect with the first electrodes 913. The inversely tapered partitions 922 are formed by a photolithography method using a positive-type photosensitive resin, a portion thereof which is unexposed to light remains as a pattern. In formation of the inversely tapered partitions 922, the amount of light or the length of development time are adjusted so that a lower portion of the pattern is etched more.

The total thickness of the partition 914 having openings and the inversely tapered partition 922 is set to be larger than the total thickness of an EL layer and a second electrode 916. Thus, an EL layer which is divided into plural regions, specifically, an EL layer (R) (915R) formed using a material which exhibits red light emission, an EL layer (G) (915G) formed using a material which exhibits green light emission, and an EL layer (B) (915B) formed using a material which exhibits blue light emission; and the second electrode 916 are formed. Note that the plurality of separated regions are electrically isolated from one another.

The second electrodes 916 are electrodes in stripes which are parallel to one another and extended in a direction intersecting with the first electrodes 913. Note that the EL layer and a part of a conductive layer forming the second electrode 916 are also formed over the inversely tapered partitions 922; however, they are separated from the EL layer (R) (915R), the EL layer (G) (915G), the EL layer (B) (915B), and the second electrodes 916. Note that the EL layer in this embodiment is a layer including at least a light-emitting layer and may include a hole-injecting layer, a hole-transporting layer, an electron-transporting layer, an electron-injecting layer, or the like in addition to the light-emitting layer.

Here, an example is described in which the EL layer (R) (915R), the EL layer (G) (915G), and the EL layer (B) (915B) are selectively formed to form a light-emitting device which provides three kinds of light emission (red (R), green (G), blue (B)) and is capable of performing full color display. Note that the EL layer (R) (915R), the EL layer (G) (915G), and the EL layer (B) (915B) are formed into stripes parallel to one another. These EL layers may be formed by a method which is described in Embodiments 1 to 4.

Furthermore, if necessary, sealing is performed using a sealant such as a sealant can or a glass substrate for sealing. Here, a glass substrate is used as a sealing substrate, and a substrate and the sealing substrate are attached to each other with an adhesive material such as a sealant to seal a space surrounded by an adhesive material such as a sealant. The space that is sealed is filled with a filler or a dried inert gas. In addition, a desiccant or the like may be put between the substrate and the sealing material to increase the reliability of the light-emitting device. The desiccant removes a minute amount of moisture for sufficient desiccation. The desiccant may be a substance which absorbs moisture by chemical adsorption, such as oxide of an alkaline earth metal typified by calcium oxide or barium oxide. Note that a substance which adsorbs moisture by physical adsorption, such as zeolite or silica gel may alternatively be used.

Note that when the sealant that covers and is contact with the light-emitting element is provided and sufficiently blocks the outside air, the desiccant is not necessarily provided.

Figure 10:
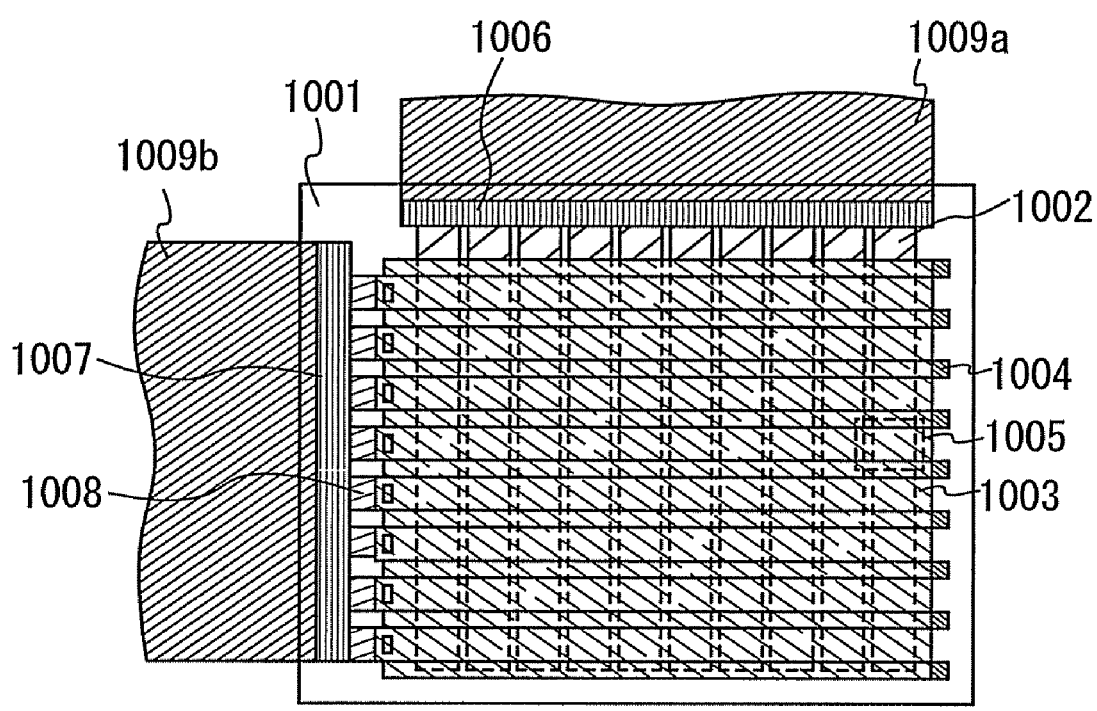
FIG. 10 shows a passive-matrix light-emitting device.

Next, FIG. 10 is a top view of the case in which the passive-matrix light-emitting device in FIGS. 9A to 9C is mounted with an FPC or the like.

In FIG. 10, scan lines and data lines intersect with each other perpendicularly in a pixel portion for displaying images.

Here, the first electrodes 913 in FIGS. 9A to 9C correspond to scan lines 1003 in FIG. 10; the second electrodes 916 correspond to data lines 1002 in FIG. 10; and the inversely tapered partitions 922 correspond to partitions 1004 in FIG. 10. An EL layer is sandwiched between the data line 1002 and the scan line 1003, and an intersection portion indicated by a region 1005 corresponds to one pixel region.

Note that the scan line 1003 is electrically connected to the end of a connection wiring 1008, and the connection wiring 1008 is connected to an FPC 1009b through an input terminal 1007. In addition, the data line 1002 is connected to an FPC 1009a through an input terminal 1006.

If necessary, a polarizing plate, a circularly polarizing plate (including an elliptically polarizing plate), a retardation plate (a quarter-wave plate or a half-wave plate), or an optical film such as a color filter may be provided as appropriate over a light-emitting surface. Further, the polarizing plate or the circularly polarizing plate may be provided with an anti-reflection film. For example, anti-glare treatment which reduce glare can be carried out by diffusion of reflected light on a roughness surface.

Although FIG. 10 shows an example in which a driver circuit is not provided over the substrate, the present invention is not particularly limited to this example. An IC chip including a driver circuit may be mounted on the substrate.

In the case where an IC chip is mounted, a data line side IC and a scan line side IC, in each of which a driver circuit for transmitting a signal to the pixel portion is formed, are mounted on the periphery of (outside of) the pixel portion by a COG method. The mounting may be performed using a TCP or a wire bonding method other than a COG method. A TCP is a TAB tape mounted with an IC, and the TAB tape is connected to a wiring over an element-forming substrate for mounting the IC. Each of the data line side IC and the scan line side IC may be formed using a silicon substrate or may include a driver circuit formed using TFTs over a glass substrate, a quartz substrate, or a plastic substrate. Although described here is an example in which a single IC is provided on one side, a plurality of ICs may be provided on one side.

Next, an example of an active-matrix light-emitting device is described with reference to FIGS. 11A and 11B. Note that FIG. 11A is a top view showing a light-emitting device and FIG. 11B is a cross-sectional view taken along dashed line A-A' in FIG. 11A. The active-matrix light-emitting device of this embodiment includes a pixel portion 1102, a driver circuit portion (a source-side driver circuit) 1101, and a driver circuit portion (a gate-side driver circuit) 1103 which are provided over an element substrate 1110. The pixel portion 1102, the driver circuit portion 1101, and the driver circuit portion 1103 are sealed with a sealant 1105 between the element substrate 1110 and a sealing substrate 1104.

In addition, over the element substrate 1110, a lead wiring 1108 for connecting an external input terminal, through which a signal (e.g., a video signal, a clock signal, a start signal, a reset signal, or the like) or an electric potential is transmitted to the driver circuit portion 1101 and the driver circuit portion 1103 is provided. Here, an example is described in which a flexible printed circuit (FPC) 1109 is provided as the external input terminal. Although only the FPC is shown here, this FPC may be provided with a printed wiring board (PWB). The light-emitting device in this specification refers to not just a light-emitting device body but a light-emitting device provided with an FPC or a PWB.

Then, a cross-sectional structure is described with reference to FIG. 11B. While the driver circuit portion and the pixel portion are provided over the element substrate 1110, FIG. 11B shows the driver circuit portion 1101, which is the source side driver circuit portion, and the pixel portion 1102.

An example is shown in which a CMOS circuit which is a combination of an n-channel TFT 1123 and a p-channel TFT 1124 is formed in the driver circuit portion 1101. Note that a circuit included in the driver circuit portion may be formed using any of a variety of CMOS circuits, PMOS circuits, or NMOS circuits. In this embodiment, a driver-integrated type in which a driver circuit is formed over a substrate is described; however, the present invention is not limited to this, and the driver circuit can be formed outside the substrate not over the substrate.

The pixel portion 1102 includes a plurality of pixels each of which includes a switching TFT 1111, a current-controlling TFT 1112, and a first electrode 1113 which is electrically connected to a wiring (a source electrode or a drain electrode) of the current-controlling TFT 1112. Note that an insulator 1114 is formed to cover an end of the first electrode 1113. Here, the insulator 1114 is formed using a positive photosensitive acrylic resin.

The insulator 1114 is preferably formed so as to have a curved surface with curvature at an upper end portion or a lower end portion in order to obtain favorable coverage of a film which is to be stacked over the insulator 1114. For example, in the case of using a positive photosensitive acrylic resin as a material for the insulator 1114, the insulator 1114 is preferably formed so as to have a curved surface with a curvature radius (0.2 µm to 3 µmm) at the upper end portion thereof. Note that either a negative photosensitive material which becomes insoluble in an etchant by light irradiation or a positive photosensitive material which becomes soluble in an etchant by light irradiation can be used for the insulator 1114. As the insulator 1114, without limitation to an organic compound, either an organic compound or an inorganic compound such as silicon oxide or silicon oxynitride can be used.

An EL layer 1100 and a second electrode 1116 are stacked over the first electrode 1113. Note that when an ITO film is used as the first electrode 1113, and a stacked-layer film of a titanium nitride film and a film containing aluminum as its main component or a stacked-layer film of a titanium nitride film, a film containing aluminum as its main component, and a titanium nitride film is used as the wiring of the current-controlling TFT 1112 which is connected to the first electrode 1113, resistance of the wiring is low and favorable ohmic contact with the ITO film can be obtained. Note that although not shown, the second electrode 1116 is electrically connected to the FPC 1109, which is an external input.

In the EL layer 1100, at least the light-emitting layer is provided, and in addition to the light-emitting layer, a hole-injecting layer, a hole-transporting layer, an electron-transporting layer, or an electron-injecting layer is provided as appropriate. The first electrode 1113, the EL layer 1100, and the second electrode 1116 are stacked, whereby a light-emitting element 1115 is formed.

Although the cross-sectional view in FIG. 11B shows only one light-emitting element 1115, a plurality of light-emitting elements are arranged in a matrix in the pixel portion 1102. Light-emitting elements which provide three kinds of light emissions (R, G, and B) are formed in the pixel portion 1102, whereby a light-emitting device capable of full color display can be formed. Alternatively, a light-emitting device capable of full color display may be formed by a combination with a color filter.

Furthermore, the sealing substrate 1104 and the element substrate 1110 are attached to each other with the sealant 1105, whereby the light-emitting element 1115 is provided in a space 1107 surrounded by the element substrate 1110, the sealing substrate 1104, and the sealant 1105. Note that the space 1107 may be filled with the sealant 1105 or with an inert gas (such as nitrogen or argon).

Note that an epoxy-based resin is preferably used for the sealant 1105. In addition, it is desirable to use a material that allows permeation of moisture or oxygen as little as possible. As the sealing substrate 1104, a plastic substrate made of fiberglass-reinforced plastics (FRP), polyvinyl fluoride (PVF), polyester, acrylic, or the like can be used as an alternative to a glass substrate or a quartz substrate.

As described above, a light-emitting device can be obtained according to the present invention. Manufacturing cost of an active-matrix light-emitting device tends to be high because the active-matrix light-emitting device requires TFTs; however, according to the present invention, it is possible to drastically reduce loss of materials in forming light-emitting elements. Thus, a reduction in manufacturing cost can be achieved.

According to the present invention, formation of an EL layer forming a light-emitting element can be facilitated as well as manufacture of a light-emitting device including the light-emitting element. Further, a minute pattern can be formed; thus, a high-definition light-emitting device can be obtained.

Note that a structure in Embodiment 6 can be combined with a structure in Embodiments 1 to 5 as appropriate.

Embodiment 7

In this embodiment, various electronic appliances are described which are completed using the light-emitting device manufactured according to the present invention with reference to FIGS. 12A to 12E.

Examples of electronic appliances manufactured using the light-emitting device according to the present invention include televisions, cameras such as video cameras or digital cameras, goggle type displays (head mounted displays), navigation systems, audio playback devices (such as a car audio and an audio component), notebook computers, game machines, portable information terminals (such as a mobile computer, a cellular phone, a portable game machine, and an electronic book reader), image reproducing devices provided with a recording medium (specifically, a device for reproducing a recording medium such as a digital video disc (DVD) and having a display device for displaying the reproduced image), lighting apparatus, and the like. Specific examples of these electronic appliances are shown in FIGS. 12A to 12E.

Figure 12A:
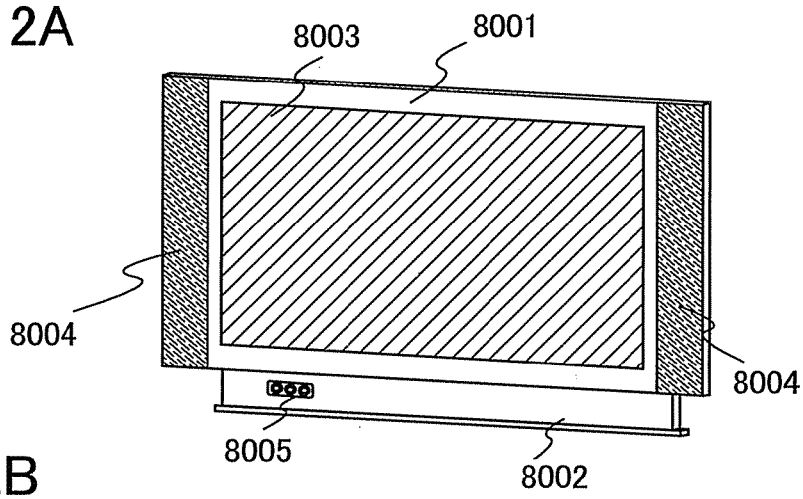
FIGS. 12A to 12E each show an electronic appliance.

FIG. 12A shows a display device which includes a chassis 8001, a support 8002, a display portion 8003, a speaker portion 8004, a video input terminal 8005, and the like. This display device is manufactured, in the display portion 8003, using a light-emitting device which is formed according to the present invention. Note that the category of the display device includes all types of information display devices, for example, display devices for a personal computer, for TV broadcast reception, for advertisement display, and the like. According to the present invention, deterioration or the like of a material during a film formation can be prevented and the film pattern can be formed with high accuracy; therefore, a high-definition display device with a high light-emitting property and a long lifetime can be provided.

Figure 12B:
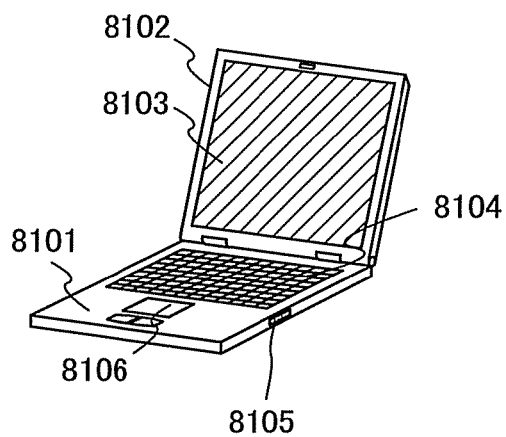

FIG. 12B shows a computer which includes a main body 8101, a chassis 8102, a display portion 8103, a keyboard 8104, an external connecting port 8105, a pointing device 8106, and the like. Note that this computer is manufactured, in the display portion 8103, using a light-emitting device which is formed according to the present invention. According to the present invention, deterioration of a material in film formation is prevented and a film pattern can be formed with high accuracy; therefore, a high-definition computer with a high light-emitting property and a long lifetime can be provided.

Figure 12C:
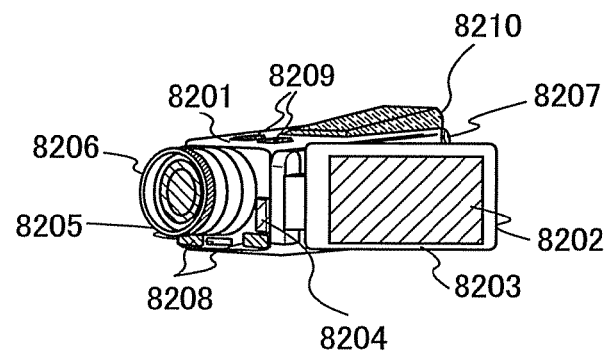

FIG. 12C shows a video camera which includes a main body 8201, a display portion 8202, a chassis 8203, an external connecting port 8204, a remote control receiving portion 8205, an image receiving portion 8206, a battery 8207, an audio input portion 8208, an operation key 8209, an eye piece portion 8210, and the like. Note that this video camera is manufactured, in the display portion 8202, using a light-emitting device which is formed according to the present invention. According to the present invention, deterioration of a material in film formation is prevented and a film pattern can be formed with high accuracy; therefore, a high-definition video camera with a high light-emitting property and a long lifetime can be provided.

Figure 12D:
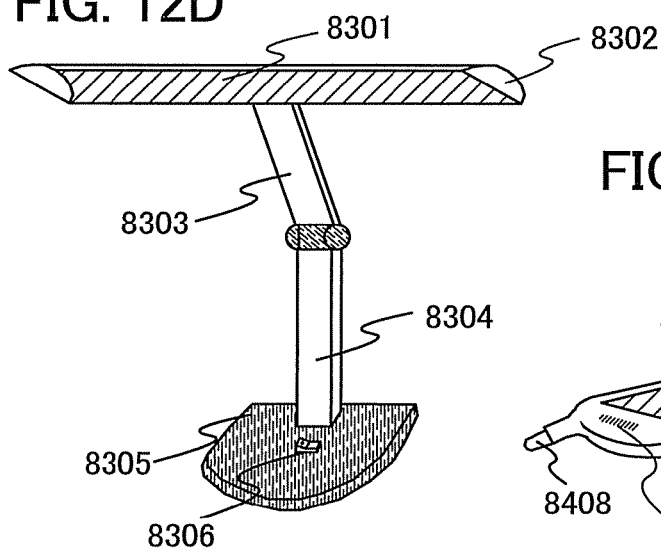

FIG. 12D shows a desk lamp which includes a lighting portion 8301, a shade 8302, an adjustable arm 8303, a support 8304, a base 8305, and a power supply switch 8306. Note that this desk lamp is manufactured, in the lighting portion 8301, using a light-emitting device which is formed according to the present invention. Note that a lamp includes a ceiling light, a wall light, and the like in its category. According to the present invention, deterioration of a material in film formation is prevented and a film pattern can be formed with high accuracy; therefore, a high-definition desk lamp with a high light-emitting property and a long lifetime can be provided.

Figure 12E:
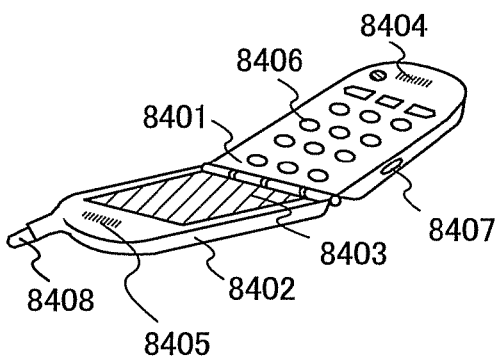

FIG. 12E shows a cellular phone which includes a main body 8401, a chassis 8402, a display portion 8403, an audio input portion 8404, an audio output power portion 8405, an operation key 8406, an external connecting port 8407, an antenna 8408, and the like. Note that this cellular phone is manufactured, in the display portion 8403, using a light-emitting device which is formed according to the present invention. According to the present invention, deterioration of a material in film formation is prevented and a film pattern can be formed with high accuracy; therefore, a high-definition cellular phone with a high light-emitting property and a long lifetime can be provided.

Figure 13A:
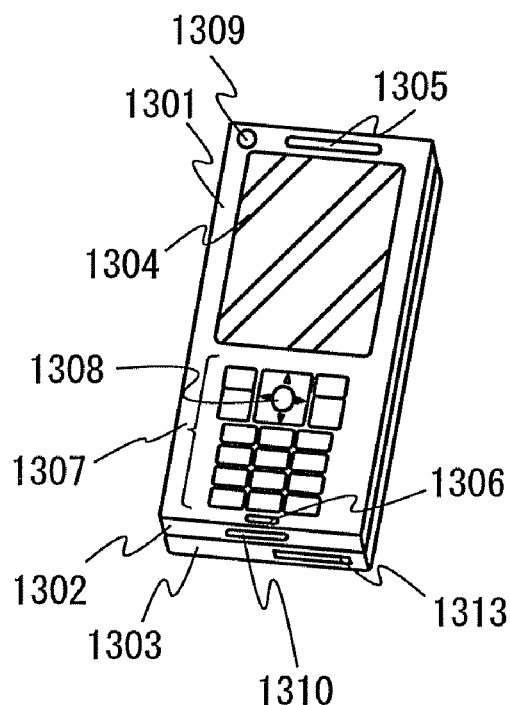
FIGS. 13A to 13C show an electronic appliance.
Figure 13B:
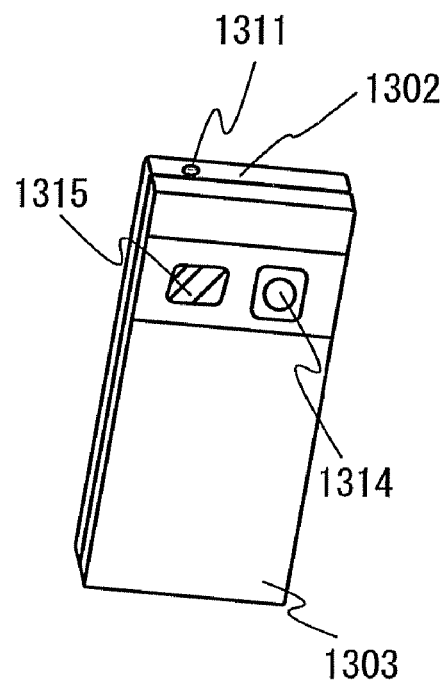
Figure 13C:
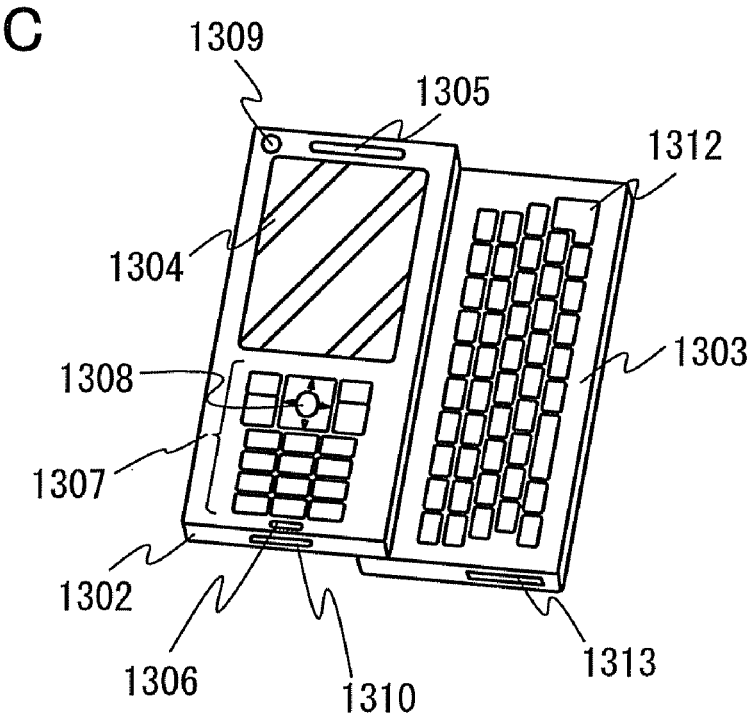

FIGS. 13A to 13C also show a cellular phone and FIG. 13A is a front view, FIG. 13B is a rear view, and FIG. 13C is a development view. This cellular phone is a so-called smart-phone in which a main body 1301 has both functions of a cellular phone and a portable information terminal, and incorporates a computer and can process a variety of data processing in addition to voice calls.

The main body 1301 has two chassis: a chassis 1302 and a chassis 1303. The chassis 1302 includes a display portion 1304, a speaker 1305, a microphone 1306, operation keys 1307, a pointing device 1308, a camera lens 1309, an external connection terminal 1310, an earphone terminal 1311, and the like, while the chassis 1303 includes a keyboard 1312, an external memory slot 1313, a camera lens 1314, a light 1315, and the like. In addition, an antenna is incorporated in the chassis 1302.

Further, in addition to the above-described structure, the smartphone may incorporate a non-contact IC chip, a small size memory device, or the like.

The light-emitting device described in the above embodiments can be incorporated in the display portion 1304, and a display orientation can be changed as appropriate according to a usage pattern. The camera lens 1309 is provided in the same plane as the display portion 1304; therefore, the smartphone can be used for videophone calls. Further, a still image and a moving image can be taken with the camera lens 1314 and the light 1315 using the display portion 1304 as a viewfinder. The speaker 1305 and the microphone 1306 can be used for videophone calls, recording and playing sound, and the like without being limited to voice calls.

With the operation keys 1307, making and receiving calls, inputting simple information such as e-mails, scrolling the screen, moving the cursor, and the like are possible. Furthermore, the chassis 1302 and the chassis 1303 which overlap each other (see FIG. 13A), can be slid to expose the chassis 1303 as shown in FIG. 13C, so that the cellular phone can be used as a portable information terminal. In this case, smooth operation is possible with the keyboard 1312 and the pointing device 1308. The external connection terminal 1310 can be connected to an AC adaptor and various types of cables such as a USB cable so that charging and data communication with a personal computer or the like are possible. Furthermore, a large amount of data can be stored with and transferred to a recording medium inserted into the external memory slot 1313.

In addition to the above described functions, the cellular phone may have an infrared communication function, a television receiver function, and the like.

Note that the above-described cellular phone is manufactured using a light-emitting device which is formed according to the present invention in the display portion 1304. According to the present invention, deterioration of a material in film formation is prevented and a film pattern can be formed with high accuracy; therefore, a high-definition cellular phone with a high light-emitting property and a long lifetime can be provided.

As described above, an electronic appliance or a lighting apparatus can be obtained by using the light-emitting device of the present invention. Usage of the light-emitting device according to the present invention is so wide that the light-emitting device can be applied to electronic appliances of various fields.

Note that a structure in Embodiment 7 can be combined with a structure in Embodiments 1 to 6 as appropriate.

This application is based on Japanese Patent Application serial No. 2008-146716 filed with Japan Patent Office on Jun. 4, 2008, the entire contents of which are hereby incorporated by reference.

What is claimed is:
1. A method for manufacturing a light-emitting device comprising:
    forming a light absorption layer on one surface of a first substrate;

forming a reflective layer having an opening in contact with the light absorption layer;

forming a material layer in contact with the light absorption layer and the reflective layer;

irradiating the one surface of the first substrate with first light to remove a part of the material layer which overlaps with the opening of the reflective layer;

facing the one surface of the first substrate and a deposition target surface of a second substrate closely;

irradiating a surface of the first substrate which is opposite to the one surface of the first substrate with second light to evaporate the material layer which overlaps with the reflective layer onto the deposition target surface of the second substrate.

2. A method for manufacturing a light-emitting device comprising:

forming a light absorption layer on one surface of a first substrate;

forming a reflective layer having an opening in contact with the light absorption layer;

forming a material layer in contact with the light absorption layer and the reflective layer;

irradiating the one surface of the first substrate with first light to remove a part of the material layer which overlaps with the opening of the reflective layer;

facing the one surface of the first substrate and a deposition target surface of a second substrate closely; and heating the first substrate to evaporate the material layer which overlaps with the reflective layer onto the deposition target surface of the second substrate.

3. The method for manufacturing a light-emitting device according to claim 1,
wherein the first light satisfies a following formula:

$$1/A_1^{1.5} \leq B_1 \leq 10^6/A_1^{1.5} \text{ and } B_1 \leq 10^{-3} \text{ (s)}$$

where light intensity is $A_1(\text{W/cm}^2)$ and irradiation time is $B_1(\text{s})$.

4. The method for manufacturing a light-emitting device according to claim 1,
wherein the first light satisfies a following formula:

$$10/A_1^{1.5} \leq B_1 \leq 10^5/A_1^{1.5} \text{ and } B_1 \leq 10^{-3} \text{ (s)}$$

where light intensity is $A_1(\text{W/cm}^2)$ and irradiation time is $B_1(\text{s})$.

5. The method for manufacturing a light-emitting device according to claim 1,
wherein the second light satisfies a following formula:

$$1/A_2^{1.5} \leq B_2 \leq 10^6/(A_2)^{1.5} \text{ and } B_2 \leq 10^{-4} \text{ (s)}$$

where light intensity is $A_2(\text{W/cm}^2)$ and irradiation time is $B_2(\text{s})$.

6. The method for manufacturing a light-emitting device according to claim 1,
wherein the second light satisfies a following formula:

$$10/A_2^{1.5} \leq B_2 \leq 10^5/(A_2)^{1.5} \text{ and } B_2 \leq 10^{-3} \text{ (s)}$$

where light intensity is $A_2(\text{W/cm}^2)$ and irradiation time is $B_2(\text{s})$.

7. The method for manufacturing a light-emitting device according to claim 1,
wherein the first light is laser light.

8. The method for manufacturing a light-emitting device according to claim 1,
wherein the first light has a wavelength of 450 nm or longer.

9. The method for manufacturing a light-emitting device according to claim 1,
wherein the light absorption layer has a reflectance of 70% or lower with respect to light.

10. The method for manufacturing a light-emitting device according to claim 1,
wherein the light absorption layer includes any of tantalum nitride, titanium nitride, chromium nitride, manganese nitride, titanium, and carbon.

11. The method for manufacturing a light-emitting device according to claim 1,
wherein the reflective layer has a reflectance of 85% or higher with respect to light.

12. The method for manufacturing a light-emitting device according to claim 1,
wherein the reflective layer includes any of aluminium, silver, gold, platinum, copper, an alloy containing aluminum, an alloy containing silver, and indium tin oxide.

13. The method for manufacturing a light-emitting device according to claim 1,
wherein the material layer is formed with an organic compound.

14. The method for manufacturing a light-emitting device according to claim 1,
wherein the material layer includes either or both of a light-emitting material and a carrier-transporting material.

15. The method for manufacturing a light-emitting device according to claim 2,
wherein the first light satisfies a following formula:

$$1/A_1^{1.5} \leq B_1 \leq 10^6/A_1^{1.5} \text{ and } B_1 \leq 10^{-3} \text{ (s)}$$

where light intensity is $A_1(\text{W/cm}^2)$ and irradiation time is $B_1(\text{s})$.

16. The method for manufacturing a light-emitting device according to claim 2,
wherein the first light satisfies a following formula:

$$10/A_1^{1.5} \leq B_1 \leq 10^5/A_1^{1.5} \text{ and } B_1 \leq 10^{-3} \text{ (s)}$$

where light intensity is $A_1(\text{W/cm}^2)$ and irradiation time is $B_1(\text{s})$.

17. The method for manufacturing a light-emitting device according to claim 2,
wherein the first light is laser light.

18. The method for manufacturing a light-emitting device according to claim 2,
wherein the first light has a wavelength of 450 nm or longer.

19. The method for manufacturing a light-emitting device according to claim 2,
wherein the light absorption layer has a reflectance of 70% or lower with respect to light.

20. The method for manufacturing a light-emitting device according to claim 2,
wherein the light absorption layer includes any of tantalum nitride, titanium nitride, chromium nitride, manganese nitride, titanium, and carbon.

21. The method for manufacturing a light-emitting device according to claim 2,
wherein the reflective layer has a reflectance of 85% or higher with respect to light.

22. The method for manufacturing a light-emitting device according to claim 2,
wherein the reflective layer includes any of aluminium, silver, gold, platinum, copper, an alloy containing aluminum, an alloy containing silver, and indium tin oxide.

23. The method for manufacturing a light-emitting device according to claim 2,
wherein the material layer is formed with an organic compound.

24. The method for manufacturing a light-emitting device according to claim 2,
wherein the material layer includes either or both of a light-emitting material and a carrier-transporting material.

25. The method for manufacturing a light-emitting device according to claim 2, the heating is performed by using a lamp selected from a discharge lamp including a flash lamp (a xenon flash lamp, a krypton flash lamp, or the like), a xenon lamp, a metal halide lamp, or the like, and a exothermic lamp including a halogen lamp, a tungsten lamp, or the like.

26. A method for manufacturing a light-emitting device comprising:
forming a light absorption layer on one surface of a first substrate;
forming a reflective layer having an opening in contact with the light absorption layer;
forming a material layer in contact with the light absorption layer and the reflective layer;
irradiating the one surface of the first substrate with first light to remove a part of the material layer which overlaps with the opening of the reflective layer;
facing the one surface of the first substrate and a deposition target surface of a second substrate closely; and
evaporating the material layer which overlaps with the reflective layer onto the deposition target surface of the second substrate.

27. The method for manufacturing a light-emitting device according to claim 26,
wherein the first light satisfies a following formula:

$$1/A_1^{1.5} \leq B_1 \leq 10^6/A_1^{1.5} \text{ and } B_1 \leq 10^{-3} \text{ (s)}$$

where light intensity is $A_1(W/cm^2)$ and irradiation time is $B_1(s)$.

28. The method for manufacturing a light-emitting device according to claim 26,
wherein the first light satisfies a following formula:

$$10/A_1^{1.5} \leq B_1 \leq 10^5/A_1^{1.5} \text{ and } B_1 \leq 10^{-3} \text{ (s)}$$

where light intensity is $A_1(W/cm^2)$ and irradiation time is $B_1(s)$.

29. The method for manufacturing a light-emitting device according to claim 26,
wherein the first light is laser light.

30. The method for manufacturing a light-emitting device according to claim 26,
wherein the first light has a wavelength of 450 nm or longer.

31. The method for manufacturing a light-emitting device according to claim 26,
wherein the light absorption layer has a reflectance of 70% or lower with respect to light.

32. The method for manufacturing a light-emitting device according to claim 26,
wherein the light absorption layer includes any of tantalum nitride, titanium nitride, chromium nitride, manganese nitride, titanium, and carbon.

33. The method for manufacturing a light-emitting device according to claim 26,
wherein the reflective layer has a reflectance of 85% or higher with respect to light.

34. The method for manufacturing a light-emitting device according to claim 26,
wherein the reflective layer includes any of aluminium, silver, gold, platinum, copper, an alloy containing aluminum, an alloy containing silver, and indium tin oxide.

35. The method for manufacturing a light-emitting device according to claim 26,
wherein the material layer is formed with an organic compound.

36. The method for manufacturing a light-emitting device according to claim 26,
wherein the material layer includes either or both of a light-emitting material and a carrier-transporting material.

* * * * *

UNITED STATES PATENT AND TRADEMARK OFFICE
CERTIFICATE OF CORRECTION

PATENT NO. : 7,919,340 B2
APPLICATION NO. : 12/476556
DATED : April 5, 2011
INVENTOR(S) : Hisao Ikeda and Takahiro Ibe It is certified that error appears in the above-identified patent and that said Letters Patent is hereby corrected as shown below:

Column 31, Claim 4, Line 43;

Change "$10/A_1^{1.5} \leq B_1 \leq 10^5/A_1^{5}$" to --$10/A_1^{1.5} \leq B_1 \leq 10^5/A_1^{1.5}$--

(Change the last superscript from "5" to "1.5").

Signed and Sealed this
Seventeenth Day of January, 2012

David J. Kappos
*Director of the United States Patent and Trademark Office*